(12) United States Patent
Simonin

(10) Patent No.: US 9,696,374 B2
(45) Date of Patent: Jul. 4, 2017

(54) GFCI SELF TEST SOFTWARE FOR AUTONOMOUS MONITORING AND FAIL SAFE POWER DENIAL

(71) Applicant: Hubbell Incorporated, Shelton, CT (US)

(72) Inventor: Stephen Paul Simonin, Northfield, CT (US)

(73) Assignee: Hubbell Incorporated, Shelton, CT (US)

( * ) Notice: Subject to any disclaimer, the term of this patent is extended or adjusted under 35 U.S.C. 154(b) by 230 days.

(21) Appl. No.: 14/577,086

(22) Filed: Dec. 19, 2014

(65) Prior Publication Data

US 2016/0178691 A1 Jun. 23, 2016

(51) Int. Cl.
*H02H 3/00* (2006.01)
*G01R 31/28* (2006.01)
*G01R 31/327* (2006.01)

(52) U.S. Cl.
CPC ....... *G01R 31/2827* (2013.01); *G01R 31/327* (2013.01)

(58) Field of Classification Search
CPC .................................................. G01R 31/2827
USPC .......................................................... 361/42
See application file for complete search history.

(56) References Cited

U.S. PATENT DOCUMENTS

| 7,791,848 | B2 * | 9/2010 | Baldwin | ................ H01H 83/04 361/42 |
| 8,125,228 | B2 * | 2/2012 | Richards | ................ G01R 31/14 324/424 |
| 8,299,799 | B2 * | 10/2012 | Finlay, Sr. | ............. H01H 83/04 324/424 |
| 8,437,108 | B1 | 5/2013 | Radosavljevic et al. | |
| 8,760,824 | B2 | 6/2014 | Armstrong | |
| 9,007,063 | B2 | 4/2015 | MacBeth et al. | |

(Continued)

OTHER PUBLICATIONS

PCT/US2015/066627 International Search Report and Written Opinion dated Jul. 5, 2016.

*Primary Examiner* — Stephen W Jackson
(74) *Attorney, Agent, or Firm* — Michael Best & Friedrich, LLP

(57) ABSTRACT

A software code operates with a circuit interrupting device having an auto-monitoring circuit including a controller for automatically testing various functions and structures of the device. The auto-monitoring circuit initiates the software code which includes an auto-monitoring routine which, among other things, establishes a self-test fault during the positive or negative half-wave of an AC power cycle and determines whether the detection mechanisms within the device properly detect the self-test fault. Moreover, the software code executed by the controller compares sensed voltages from test signals with a determined or set maximum voltage value and compares the sensed voltages with a set or determined minimum voltage value. The sensed voltages must be greater than the maximum voltage value or lower than the minimum voltage value for a predetermined number of counts before an end-of-life state is determined for the circuit interrupting device. The number of counts reduces the likelihood of false detections of error conditions by the auto-monitoring circuit when determining whether the circuit interrupting device has reached the end of its useful life.

15 Claims, 20 Drawing Sheets

(56) References Cited

U.S. PATENT DOCUMENTS

| | | | |
|---|---|---|---|
| 9,118,174 B2* | 8/2015 | Simonin | H02H 1/0092 |
| 2010/0238597 A1 | 9/2010 | Baldwin et al. | |
| 2011/0216453 A1* | 9/2011 | Haines | H02H 9/00 361/49 |
| 2014/0268437 A1 | 9/2014 | Simonin | |
| 2015/0200533 A1 | 7/2015 | Simonin | |

* cited by examiner

| FIG. 4 | |
|---|---|
| FIG. 4A | FIG. 4B |
| FIG. 4C | FIG. 4D |

FIG. 6D1

| FIG. 6D |
|---------|
| FIG. 6D1 |
| FIG. 6D2 |

Once every 1000 instruction steps = (once every 1 msec)

TIM0_COMPA (1 msec counter) (TIMERS) - Interrupt
*{Timer0 Compare A Handler}*
Save status in SREG
- Is AMR FLAG Clear? → YES → Inc CNT_AM (increment 1 ms counter)

→ TIM0_CONT     (10ms counter)
Dec CNT10ms
- 100ms elapsed?
- Is LED_10ms FLAG Clear? → YES → Turn OFF PB0 (pin1) (PORTB cbi)
- Is EOL FLAG Clear? → YES → Set PB0 pin1 to INPUT (DDRB, cbi)
Clear LED_10ms FLAG
Reset CNT10ms counter → TIM0_100ms     (100ms counter)
Decrement CNT100ms
- Is counter at 0? (100msec elapsed) 100ms complete? Reset
- Is LED_100ms FLAG Clear? (PORTB) → YES → Set PB0 ON LED ON pin 1 (PORTB)
Set LED_10ms FLAG (LED ON)
Clear LED_100ms FLAG
Clear FAIL FLAG

→ Ⓐ
→ Ⓑ

NOTES TIMERS
1 ms counter
AMR 1st set in 3 sec timer
CNT_AM counts 1ms during test pulse samples, >10 = fail

10ms counter
Toggles LED OFF 10ms after 100ms OFF FLAG
Controls the PIN 1 IN state
Controlled by LED_10ms FLAG
&EOL FLAG
Pin 1 is input for sampling test pulse
Pin 1 is output to turn on LED

100ms counter
Controlled by AMFAIL FLAG
&LED_100ms FLAG
Controls pin 1 turn ON LED

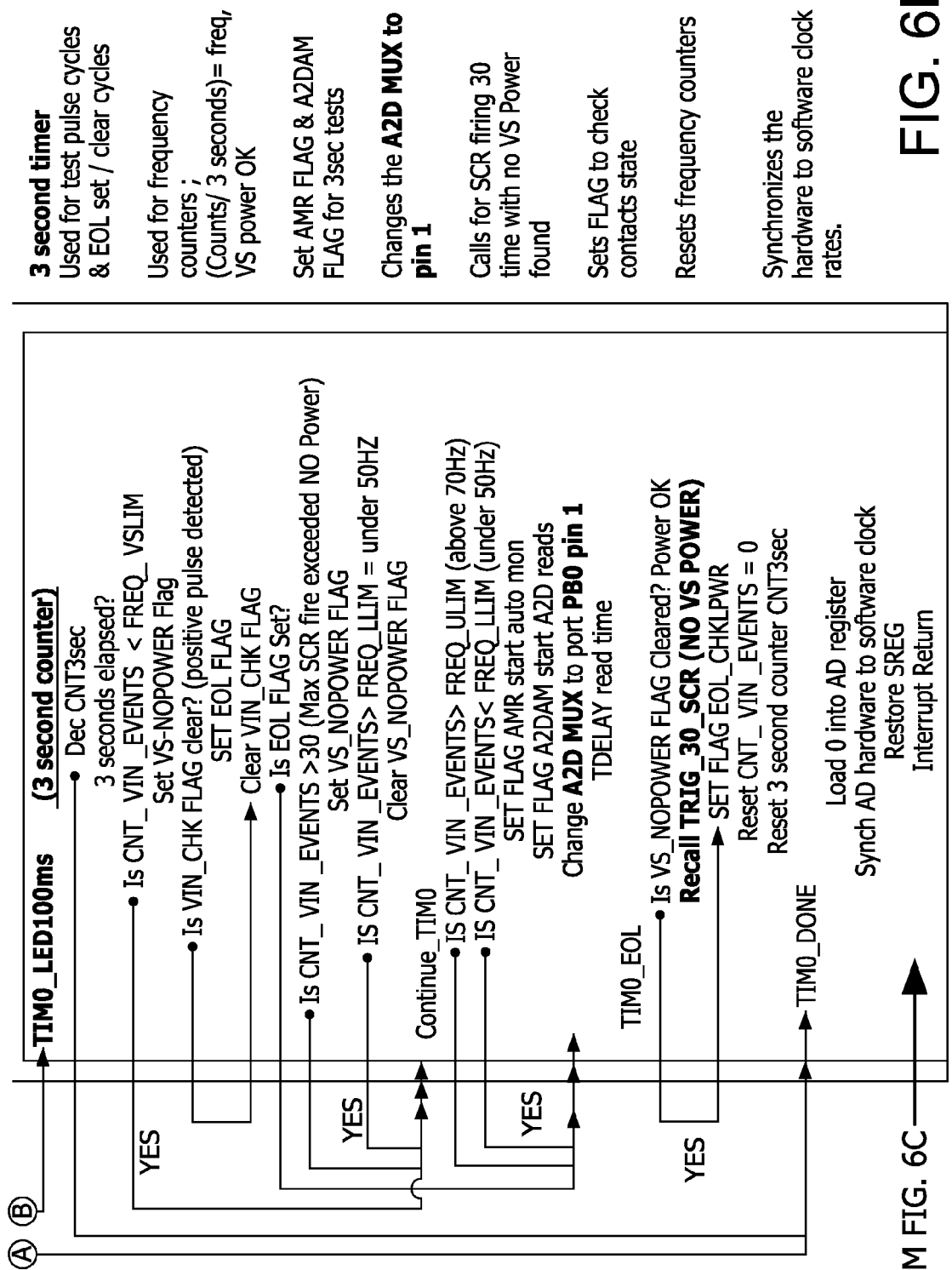
FIG. 6D2

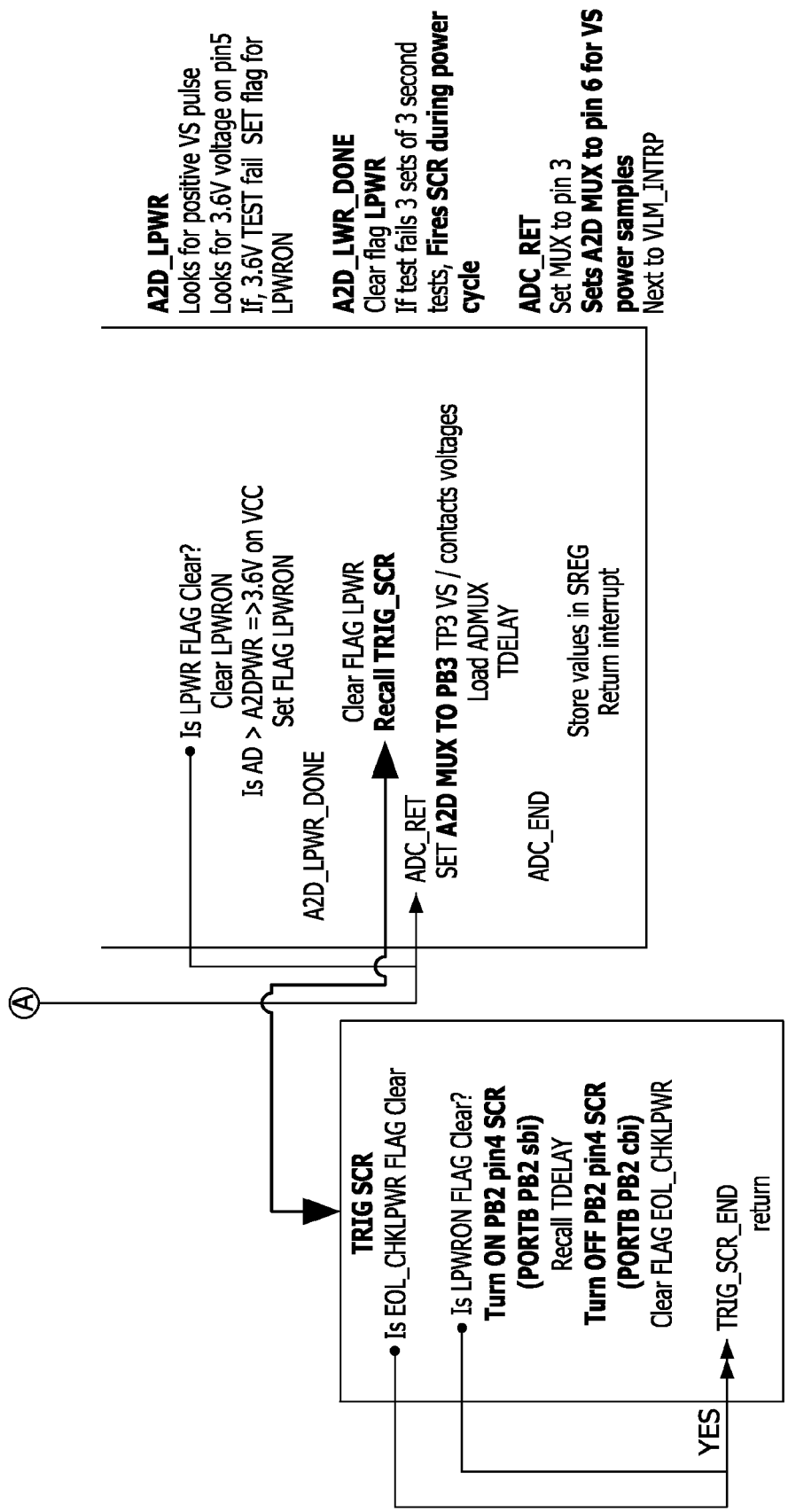
FIG. 6G2

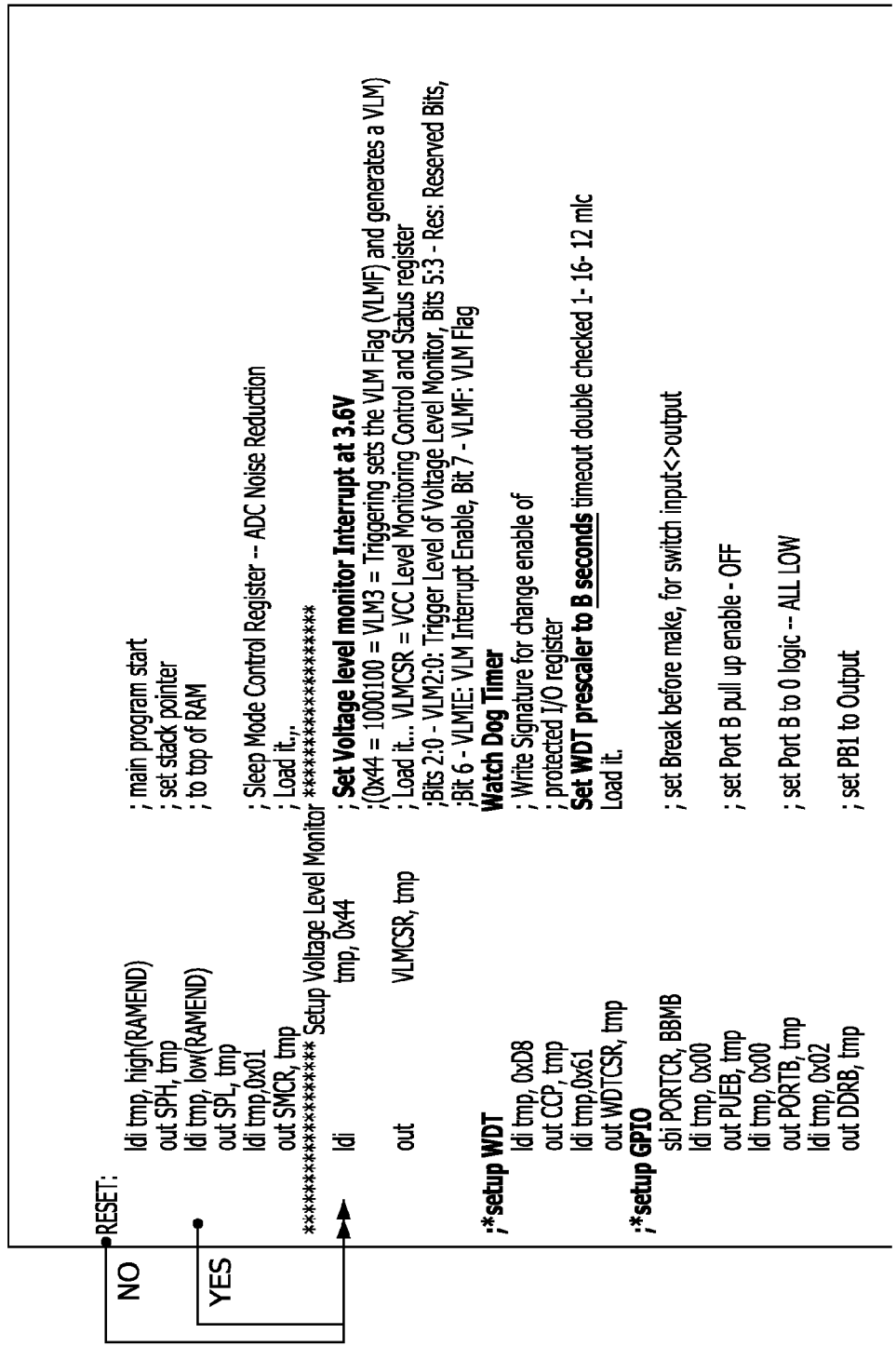
FIG. 6H1

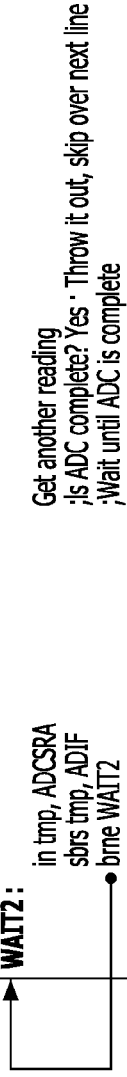
FIG. 6H2

```
        ldi tmp, 0x00
        out TCNT0H, tmp
        out TCNT0L, tmp          ; Load count value ldi tmp, (1<<CS00)
        out TCCR0B, tmp ldi tmp, (1<<OCIE0A)
        out TIMSK0, tmp          ; enable timer/compare interrupt A ldi tmp, (1<<OCF0A)
        out TIFR0, tmp           ; enable the timer/compare interrupt A sei                      ; enable ALL interrupts
        rjmp MAIN ;Program MAIN MAIN:
        ldi CNT10ms, 0x0A        ; Load 10msec timer/counter with 10 based on 1msec tick
        ldi CNT100ms, 0x64       ; Load 100msec timer/counter with 100 based on 1msec tick
        ldi CNT3sec, 0x1E        ; Load 3sec timer/counter with 30 based on 100msec counter ldi CNT_FAILURES, CNT_LIMIT    current count down failure count is set to 3 ldi gFlagsA, 0x00        clear all flags
        ldi gFlagsB, 0x00        clear all flags
LOOP:
```

FIG. 6H3

Basic start up functions

```
.org 0x000
rjmp RESET          ; Jump to Reset (rjmp = relative jump)
reti                ; INT0 (reti - Interrupt Return)
rjmp PC_INTERPT     ; Jump to PC_INTRPT (GP3 Pin Change Interrupt PCINT3)
reti                ; TIM0_CAPT (Interrupt Return TIM0_CAPT - Timer0 Capture Handler)
reti                ; TIM0_OVF       (Interrupt Return TIM0_OVF - Timer0 Overflow Handler)
rjmp TIM0_COMPA     ; Jump to TIM0_COMPA (Interrupt Vector TIM0_COMPA - Timer0 Compare A Handler)
reti                ; TIM0_COMPB (Interrupt Return TIM0_COMPB - Timer0 Compare B Handler)
reti                ; ANA_ COMP (Interrupt Return ANA_COMP - Analog Comparator Handler)
rjmp WDT_INTRPT     ; Jump to WDT_INTRPT  (Watchdog Interrupt Handler)
rjmp VLM_INTRPT     ; Jump to VLM_INTRPT (Interrupt Vector VLM - Voltage Level Monitor Handler)
rjmp A2D            ; Jump to A2D (Interrupt Vector ADC - ADC Conversion Handler)
```

FIG. 7

GFCI SELF TEST SOFTWARE FOR AUTONOMOUS MONITORING AND FAIL SAFE POWER DENIAL

CROSS-REFERENCE TO RELATED APPLICATIONS

This application contains subject matter related to the subject matter contained in copending U.S. patent application Ser. No. 14/204,946, titled, "GFCI SELF TEST SOFTWARE FUNCTIONAL PROGRAM FOR AUTONOMOUS MONITORING AND FAIL SAFE POWER DENIAL OPERATIONS," by Stephen P. Simonin, U.S. patent application Ser. No. 14/577,164, titled, "GFCI TEST MONITOR CIRCUIT," by Stephen P. Simonin, and U.S. patent application Ser. No. 14/577,048, titled, "GFCI SELF TEST LINE AND LOAD CONTACTS IMPROVED ALIGNMENT," by Stephen P. Simonin, the entire contents of each of which are expressly incorporated herein by reference.

FIELD OF THE INVENTION

The present invention relates generally to switched electrical devices. More particularly, the present invention is directed to software code for operating a circuit interrupting device having an auto-monitoring circuit for automatically testing various functions and structures of the device. The auto-monitoring circuit initiates the software code which includes an auto-monitoring routine which, among other things, establishes a self-test fault during the positive or negative half-wave of an AC power cycle and determines whether the detection mechanisms within the device properly detect the self-test fault. An early detection signal indicates that the self-test fault was properly detected without interfering with the normal operation of the detection circuitry and without causing a false trip within the device. Additional functionality of the software code permits automatic verification when the device has reached the end of its useful life.

DESCRIPTION OF RELATED ART

GFCI devices having contacts that are biased toward the open position require a latching mechanism for setting and holding the contacts in a closed position. Likewise, switched electrical devices having contacts that are biased toward the closed position require a latching mechanism for setting and holding the contacts in an open position. Examples of conventional types of devices include devices of the circuit interrupting type, such as circuit breakers, arc fault interrupters and GFCIs, to name a few.

To be commercially sold in the United States a GFCI device must conform to standards established by the Underwriter's Laboratory ("UL") in conjunction with industry-leading manufacturers as well as other industry members, such as various safety groups. One UL standard covering GFCI devices is UL-943, titled "Standard for Safety—Ground Fault Circuit Interrupters." UL-943 applies to Class A, single- and three-phase, GFCIs intended for protection of personnel and includes minimum requirements for the function, construction, performance, and markings of such GFCI devices. UL-943 requires, among other things, specific fault current levels and response timing requirements at which the GFCI device should trip. Typically, GFCIs are required to trip when a ground fault having a level higher than 5 milliamps ("mA") is detected. Further, when a high resistance ground fault is applied to the device, the present version of UL-943 specifies that the device should trip and prevent current from being delivered to the load in accordance with the equation, $T=(20/I)^{1.43}$, where T refers to time and is expressed in seconds and I refers to electrical current and is expressed in milliamps. Thus, in the case of a 5 mA fault, the device must detect the fault and trip in 7.26 seconds or less.

With such safety-related standards in place, and because GFCI devices are directly credited with saving many lives since their introduction in the early 1970s, they have become ubiquitous throughout the residential and commercial electrical power grid. Like most electro-mechanical devices, however, GFCI devices are susceptible to failure. For example, one or more of the electronic components that drive the mechanical current interrupter device can short-out or otherwise become defective, as can components in the fault detector circuit or elsewhere within the device, rendering the device unable to properly detect the ground fault and/or properly interrupt the flow of electrical current. For this reason it has long been required that GFCI devices be provided with a supervisory circuit that enables manual testing of the ability of the device to trip when a fault is encountered. Such supervisory circuits are typically have a TEST button which, when pressed, actuates a simulated ground fault on the hot and neutral conductors. If the device is functioning properly the simulated fault is detected and the device will trip, i.e., the mechanical interrupter is actuated to open the current path connecting the line side of the device, e.g., where the in AC power is supplied, and load side, where the user connects his or her electrical appliance, etc. and where downstream receptacles or additional GFCI devices are connected.

A study performed by industry safety groups indicated that most often the public does not regularly test their GFCI devices for proper operation, i.e., by pressing the TEST button. This study further revealed that some GFCI devices that had been in service for an extended period of time became non-functional and were unable to properly detect a fault condition, thus, rendering the device unsafe. Specifically, it was discovered that after extended use GFCI devices fail to trip when a fault occurs, thus rendering the device operable as an electrical receptacle but unsafe in the presence of a fault condition. Because the devices are not being regularly tested, this unsafe condition is exacerbated. That is, people falsely believe the device is operational, in view of the fact that it adequately delivers power, when in fact the device is a potentially life-threatening hazard.

The discovery that GFCI devices deployed in the field are becoming increasingly non-operational and unsafe in combination with the realization that people do not regularly test their GFCI devices, regardless of manufacturer's explicit instructions to do so, initiated investigations into possible changes to the UL-943 standard to require the GFCI devices to self-test (e.g., auto-monitor) themselves without the need for human intervention. The changes contemplated to UL-943 further included a requirement for either a warning to the consumer of the loss of protection and/or the device automatic removing itself from service, e.g., permanently tripping. Moreover, these additional self-testing operations would have to be performed without interfering with the primary function of the device, i.e., tripping when an actual fault was encountered.

The revised self-test functionality mentioned above is not yet a requirement for UL-943 certification, but it is expected that it will be soon. In preparation for this significant UL change, and in view of the seemingly endless reduction in the cost of integrated circuits, many GFCI manufacturers have migrated to digital techniques (e.g., microprocessors and microcontrollers) in favor of previous analog designs to provide both ground fault protection and self-monitoring functionality. The digital solutions offered thus far, however, are not ideal. For example, several related art GFCI designs, including those directed at providing self-test functionality, suffer from nuisance tripping, a situation where the interrupter is actuated when neither a real ground fault, a manually generated simulated ground fault, nor an automatic self-test fault are present. This unfavorable condition is believed by many to be worsened by the additional requirement of automatic self-testing, which results in additional inductive currents being generated within the device.

It is therefore desired to provide a GFCI device that provides certain self-testing capabilities, including those proposed in the next revision of UL-943, but minimizes the risks associated with nuisance tripping.

SUMMARY

In consideration of problematic issues associated with related art GFCI devices, including but not limited to the problematic issues discussed above, a circuit in accordance with one or more exemplary embodiments of the present invention generally relates to an auto-monitoring circuit that continuously monitors the performance of a GFCI device. More specifically, a processing device, such as a microcontroller or microprocessor, is configured to periodically perform an auto-monitoring routine based on a stored software program for testing and verifying the viability and functionality of various sub-circuits within the GFCI device. To test proper current isolation of the GFCI device, a driver coupled to the microcontroller is operated to initiate a test signal representative of a ground fault each time the auto-monitoring routine is performed, or run, and different circuit nodes are monitored to confirm proper operation of the device.

An end-of-life indicator is also coupled to the microcontroller to indicate whether the GFCI device has failed to properly detect the test signal or some other malfunction within the device has occurred. To avoid tripping the mechanical current-interrupting device when the test signal is generated, but also allow as much of the GFCI device circuitry to perform its intended function, a unique monitor circuit is provided that takes advantage of various functionality of the digital components, such as the GFCI integrated circuit device and the microcontroller. Specifically, to provide an automatic test function that monitors the fault detection capability of the GFCI device without interfering and causing a false trip under normal conditions, embodiments consistent with the invention include a specifically selected filter capacitor associated with the interrupter drive output of the GFCI integrated circuit ("IC") device. Proper selection of the capacitor and other related circuit components prevents the interrupter drive circuit, e.g., silicon controlled rectifier ("SCR"), from firing, or turning ON, until a real fault condition is encountered.

In accordance with one aspect of the invention, a recordable medium is provided on which software code is stored, the software code comprising code for auto-monitoring an electrical wiring device, code for monitoring a test signal output from a fault detection circuit to determine an operational state of the electrical wiring device, code for determining an end-of-life state if the test signal from the fault detection circuit is less than a threshold value; and code for generating an alarm signal when the end-of-life state is determined.

In accordance with another aspect of the invention, a method for auto-monitoring a ground fault circuit interrupter device comprises the steps of: monitoring a test signal output from a fault detection circuit to determine an operational state of the electrical wiring device; determining an end-of-life state if the test signal from the fault detection circuit is less than a minimum threshold value for a first predetermined number of testing times within a first predetermined time period; determining the end-of-life state if the test signal from the fault detection circuit is greater than a maximum threshold value for a second predetermined number of testing times within a second predetermined time period; and generating an alarm signal when the end-of-life state is determined.

Other aspects of the invention will become apparent by consideration of the detailed description and accompanying drawings.

BRIEF DESCRIPTION OF THE DRAWINGS

Exemplary embodiments of the disclosed invention are described in detail below by way of example, with reference to the accompanying drawings.

FIGS. 6D1 and 6D2 is a further portion of the system level flow diagram referenced in FIG. 6A illustrating the operations of the software code in accordance with an exemplary embodiment of the present invention.

FIGS. 6G1 and 6G2 is a further portion of the system level flow diagram referenced in FIG. 6A illustrating the operations of the software code in accordance with an exemplary embodiment of the present invention.

FIG. 6H1-6H3 is a further portion of the system level flow diagram referenced in FIG. 6A illustrating the operations of the software code in accordance with an exemplary embodiment of the present invention.

FIG. 7 is a system level diagram showing the basic startup operations of the software code in accordance with an exemplary embodiment of the present invention.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Exemplary embodiments of devices consistent with the present invention include one or more of the novel mechanical and/or electrical features described in detail below. For example, one or more The method and apparatus are particularly useful for carrying out image recognition or "fingerprinting" of a movable object, such as a person or a movable vehicle, and performing reacquisition of the movable object after a temporary loss of tracking, of the exemplary embodiments of the invention disclosed include auto-monitoring or, self-test, features. Some self-test features and capabilities with respect to GFCI devices have been disclosed previously, for example, in U.S. Pat. Nos. 6,807,035, 6,807,036, 7,315,437, 7,443,309 and 7,791,848, and U.S. patent application Ser. No. 13/422,790, filed on Mar. 16, 2012 and published as U.S. patent publication 2013/0242440, all which are commonly assigned to the same assignee of this application and the entire respective contents of which are incorporated herein by reference for all that is taught. An auto-monitoring feature consistent with the present invention disclosed herein is more robust than that which has been previously disclosed and reduces the probability of false or nuisance tripping by the device. For example, additional features are provided that relate to the determination of an end-of-life ("EOL") condition and actions taken subsequent to such determination. Further exemplary novel electrical and mechanical features consistent with the invention are described herein below with reference to the figures.

Figure 1:
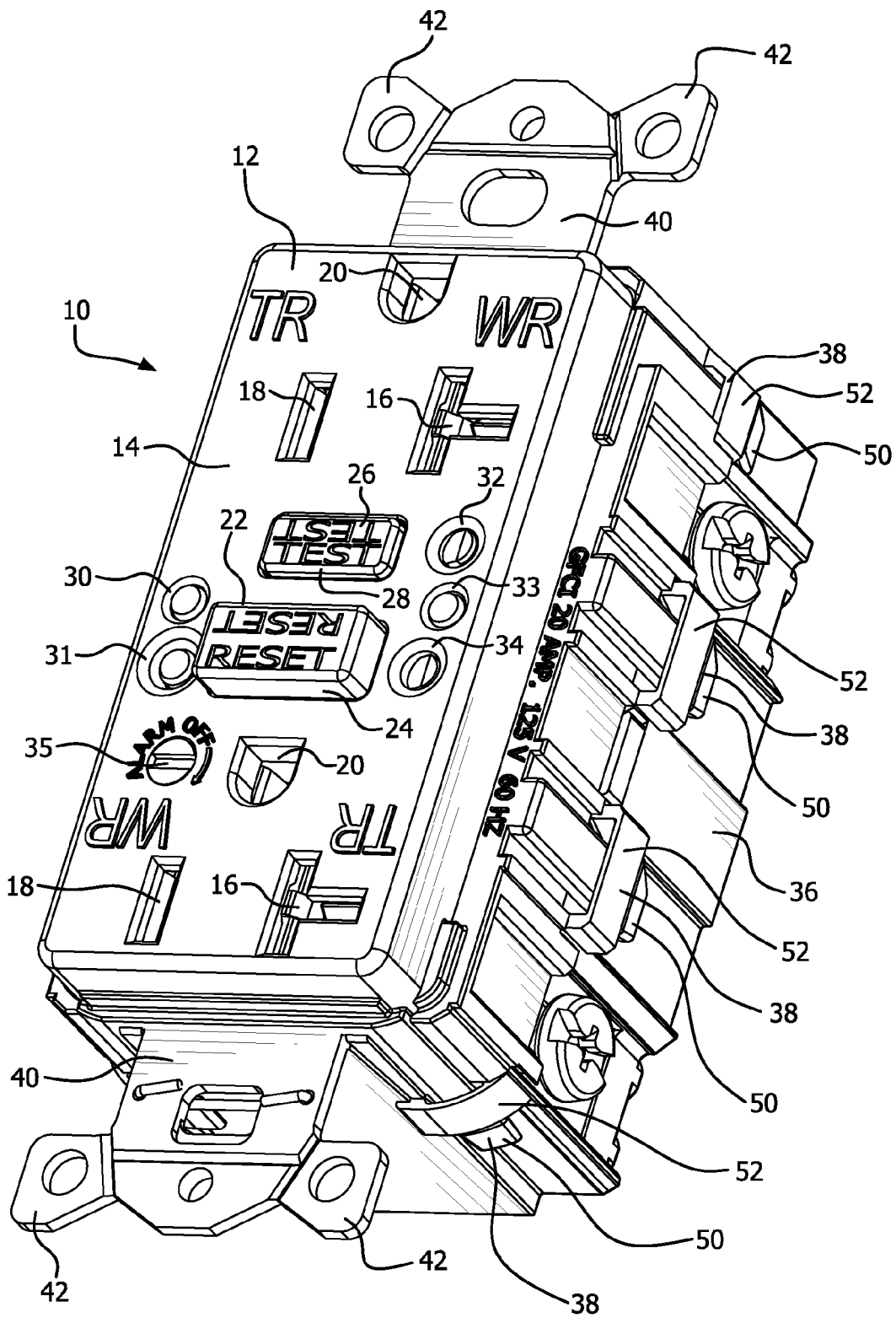
FIG. 1 is a side elevation view of a self-testing GFCI receptacle device in accordance with an exemplary embodiment of the present invention.

Referring to FIG. 1, a GFCI receptacle 10 according to an exemplary embodiment of the invention includes a front cover 12 having a duplex outlet face 14 with phase 16, neutral 18 and ground 20 openings. Face 14 also has opening 22 accommodating RESET button 24 adjacent opening 26 accommodating TEST button 28 and six respective circular openings, 30-35. In accordance with this exemplary embodiment openings 30, 33 accommodate two respective indicators, such as different colored LEDs, openings 32, 34 accommodate respective bright LEDs used, for example, as a nightlight, opening 31 accommodates a photoconductive photocell used, for example, to control the nightlight LEDs, and opening 35 provides access to a set screw for adjusting a photocell device in accordance with this and other exemplary embodiments. Rear cover 36 is secured to front cover 12 by eight fasteners 38—four fasteners 38 are shown in FIG. 1 and four additional fasteners are provided on the side of receptacle 10 obscured from view in FIG. 1. For example, each fastener 38 may include a barbed post 50 on front cover 12 and corresponding resilient hoop 52 on rear cover 36, similar to that which is described in detail in U.S. Pat. No. 6,398,594, the entire contents of which are incorporated herein by reference for all that is taught. Ground yoke/bridge assembly 40 having standard mounting ears 42 protrudes from the ends of receptacle 10.

Figure 2:
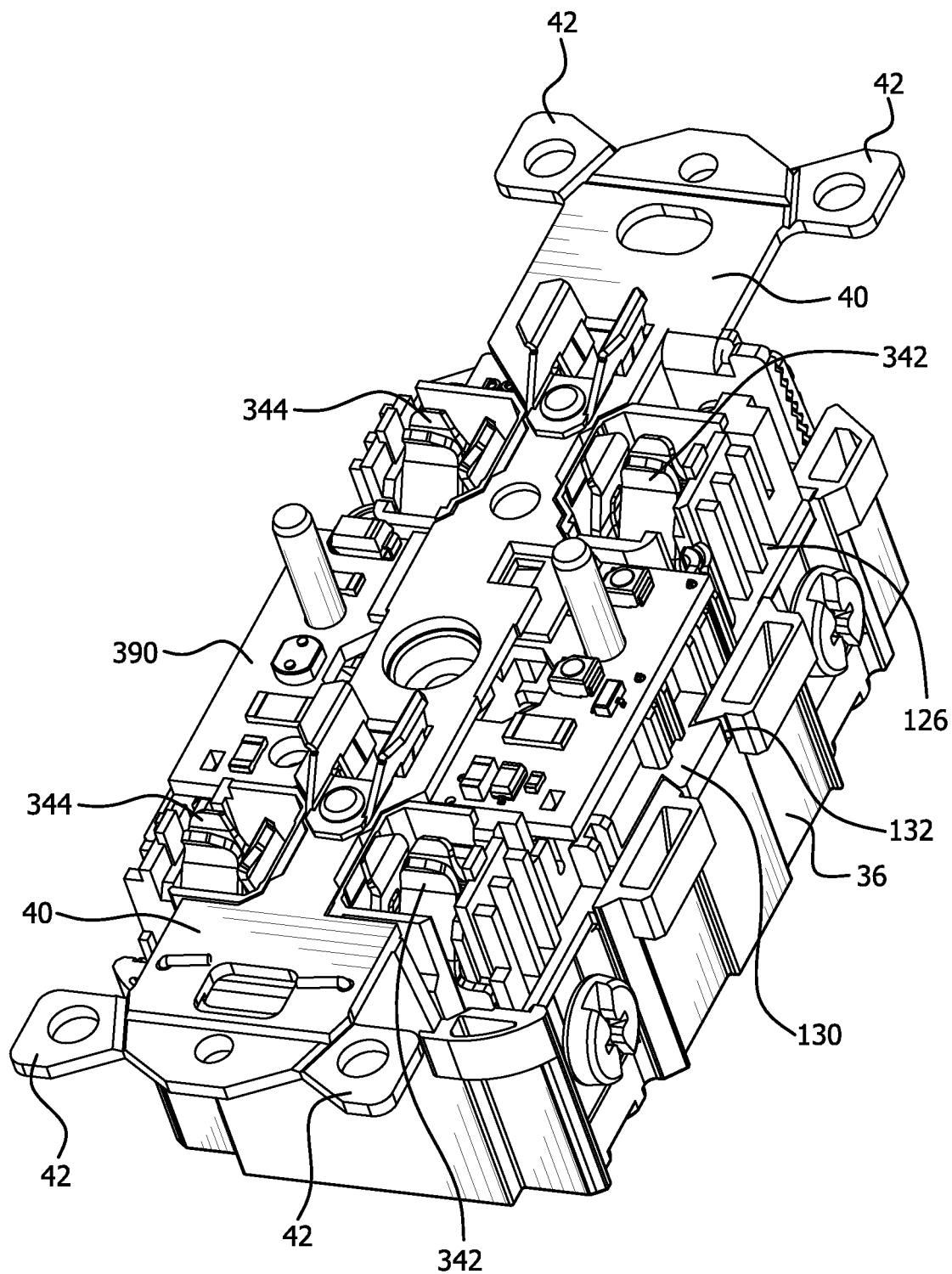
FIG. 2 is a side elevation view of the self-testing GFCI receptacle shown in FIG. 1 with the front cover of the housing removed.

Referring to FIG. 2, front cover 12 has been removed to expose manifold 126, which provides support for printed circuit board 390 and yoke/bridge assembly 40. According to the embodiment shown, manifold 126 includes four dovetail interconnects 130 that mate with corresponding cavities 132 along the upper edge of rear cover 36. One dovetail-cavity pair is provided on each of the four sides of manifold 126 and rear cover 36, respectively.

Figure 3:
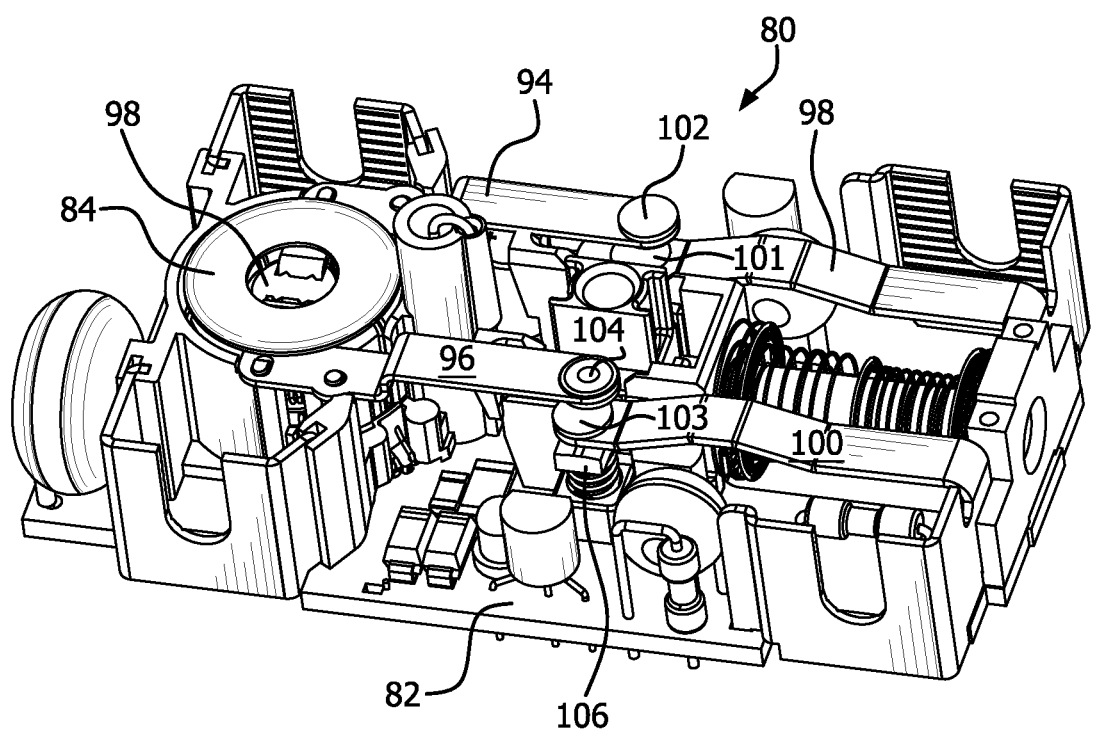
FIG. 3 is a side elevation view of a core assembly of the self-testing GFCI receptacle device shown in FIG. 1.
Figure 4A:
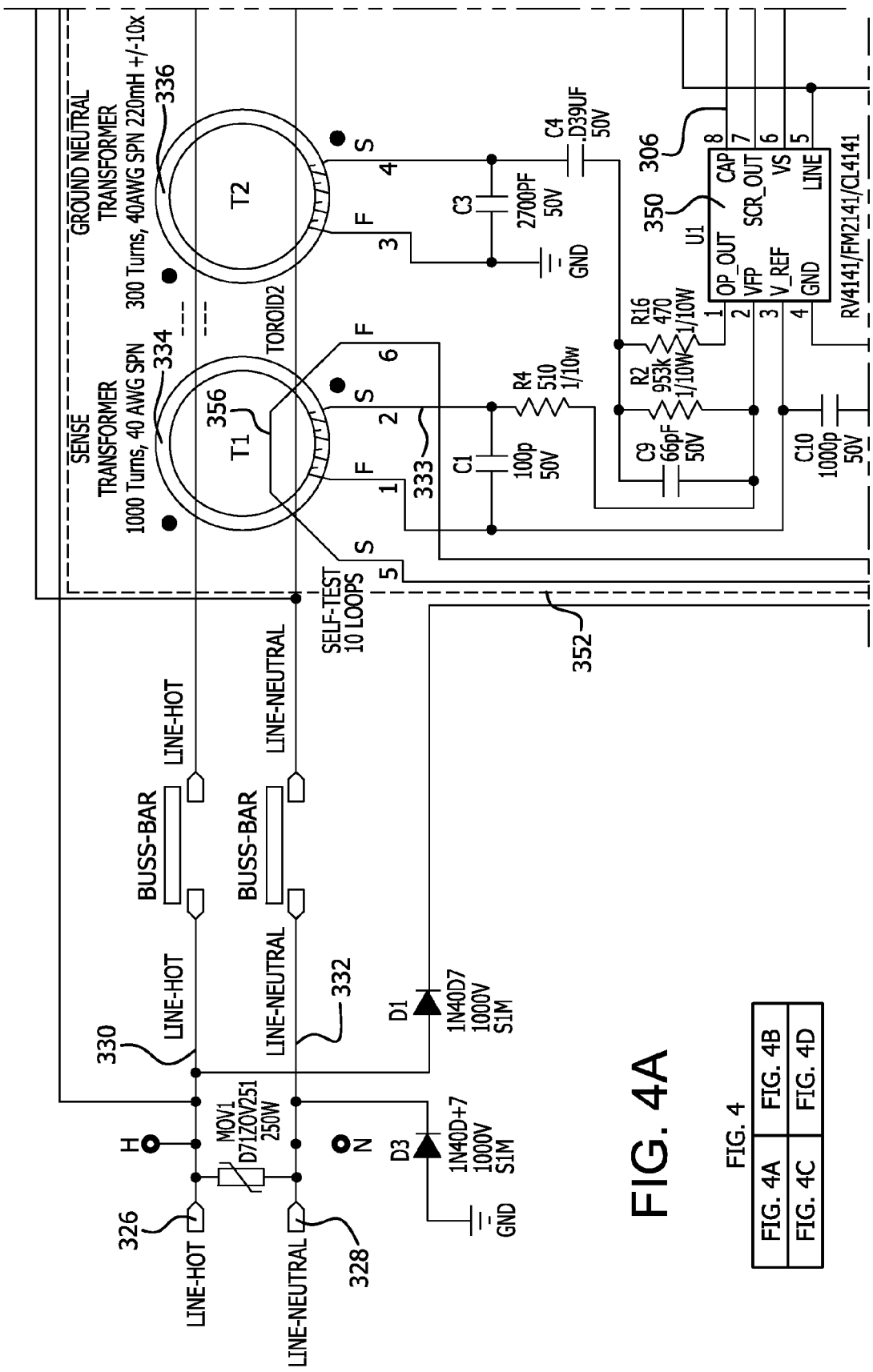
FIGS. 4A-4D is a schematic of an exemplary circuit consistent with an exemplary embodiment of the present invention.
Figure 4B:
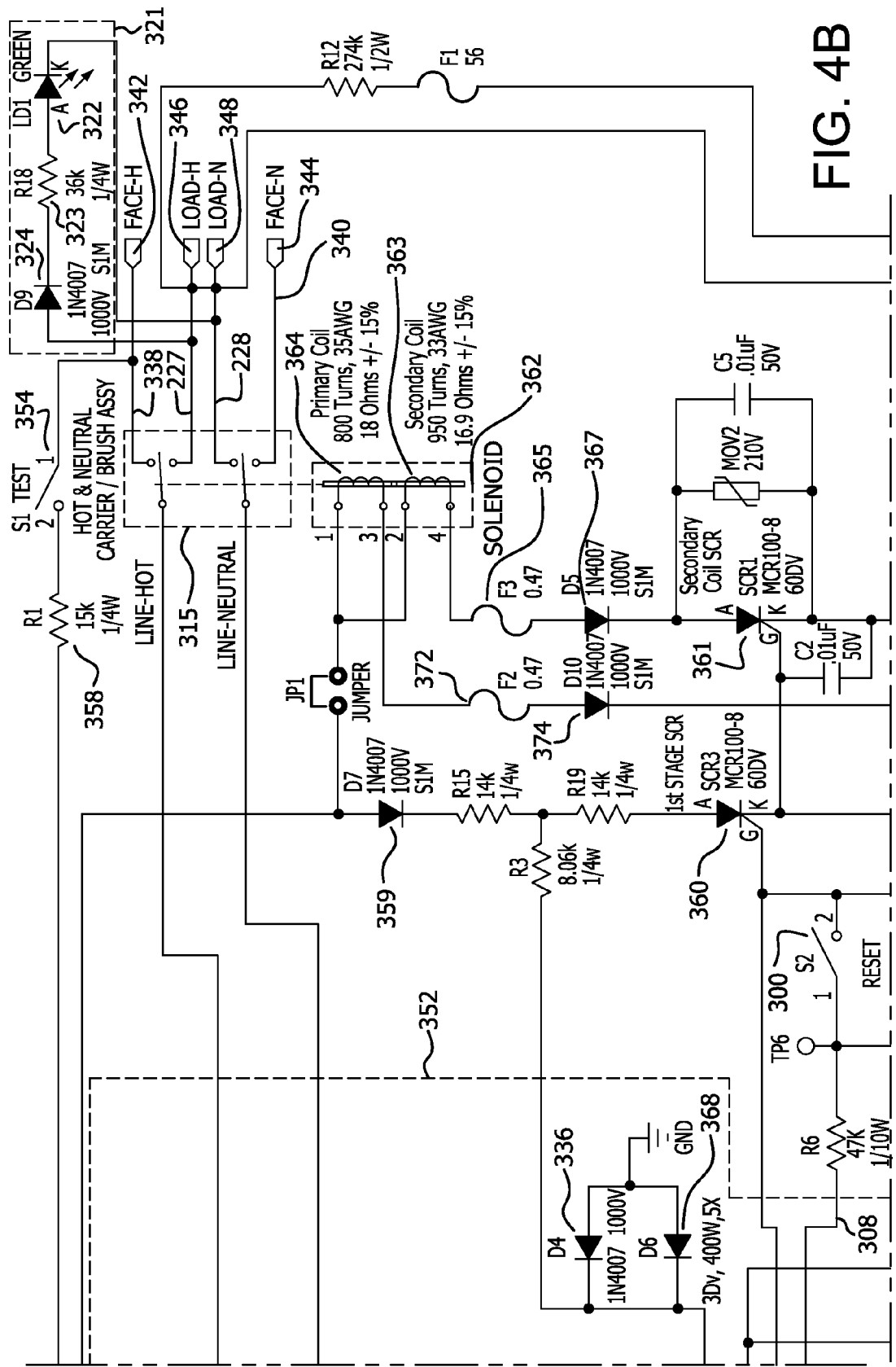
Figure 4C:
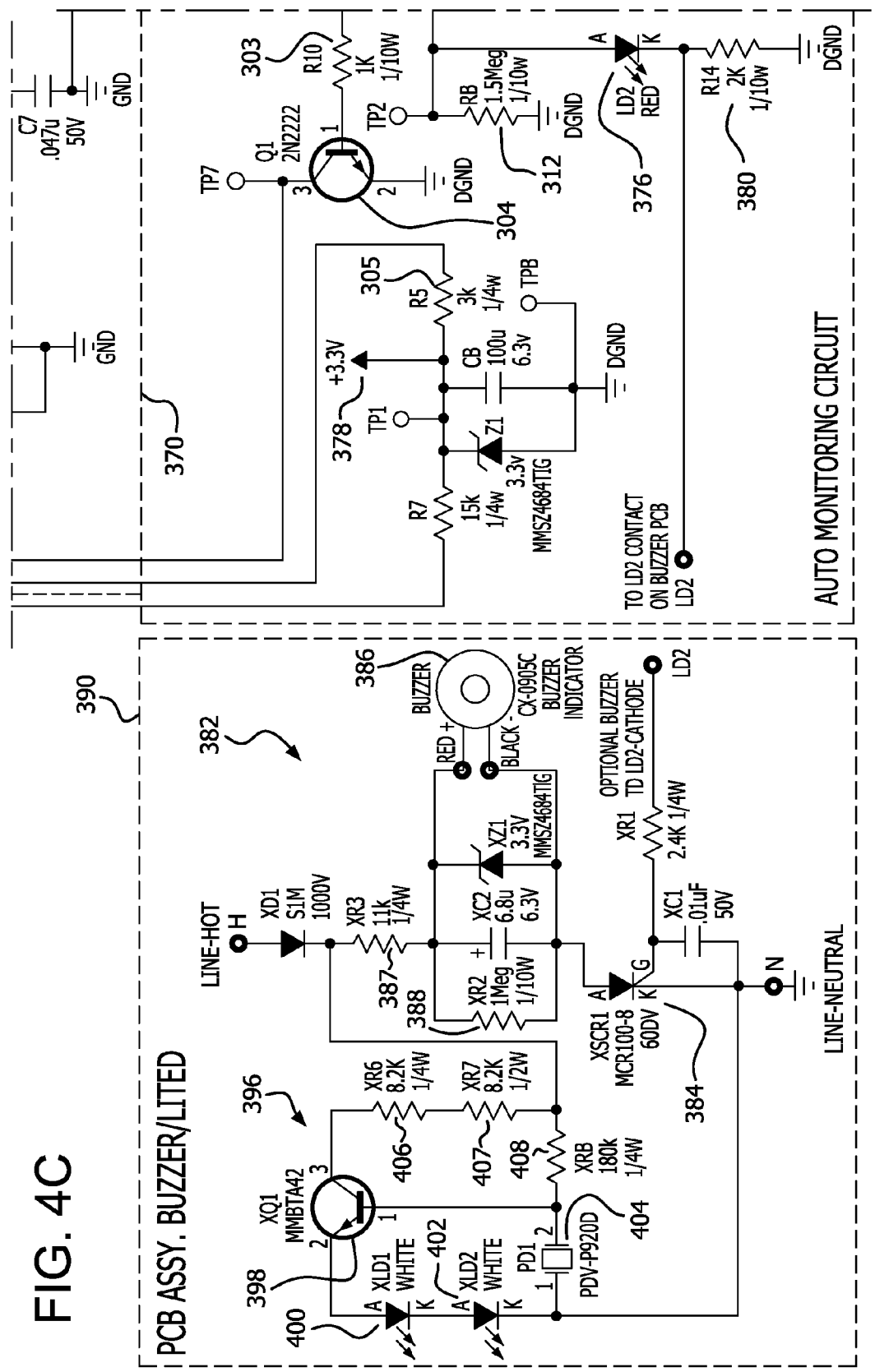
Figure 4D:
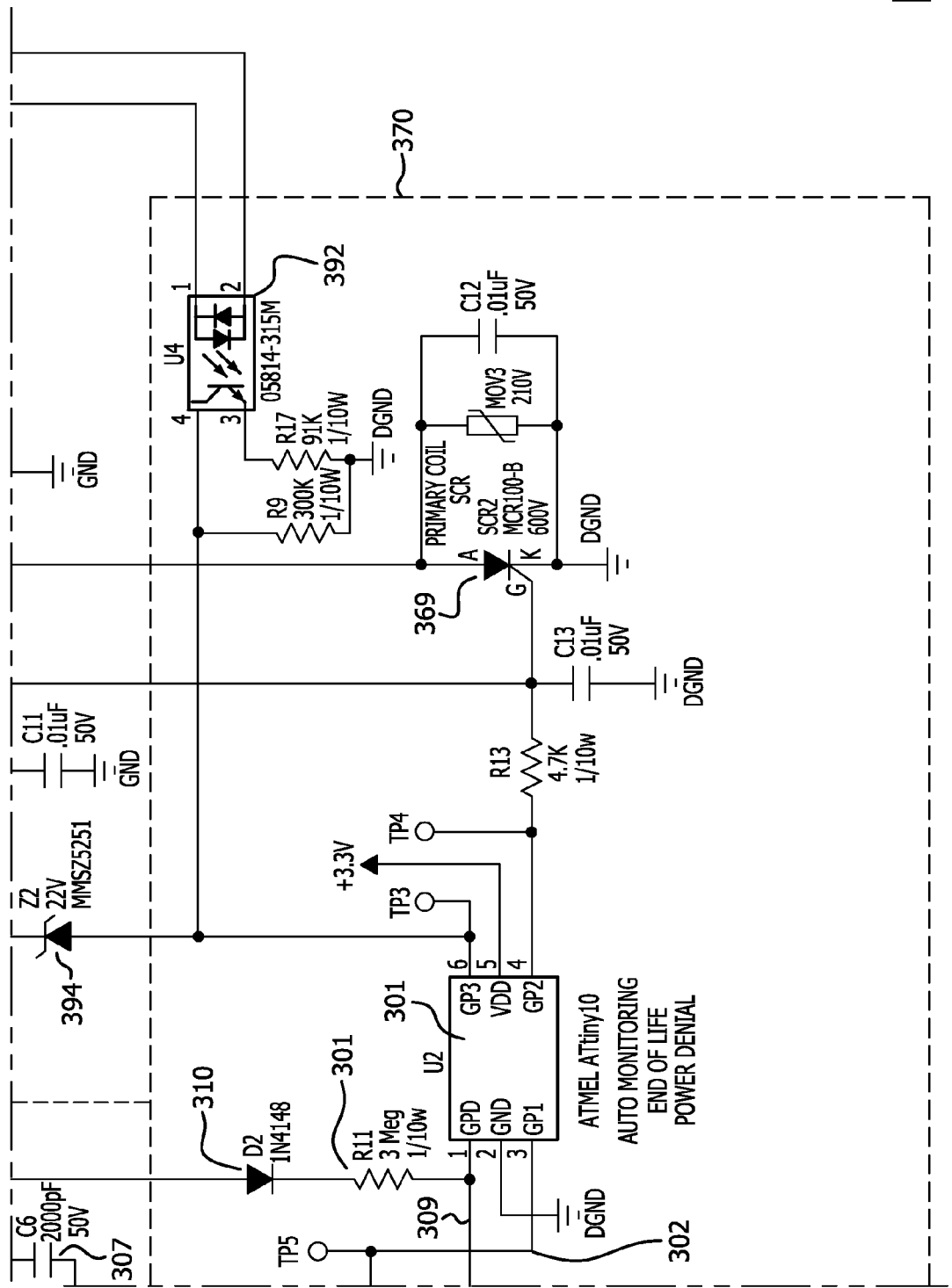

FIG. 3 is a side elevation view of core assembly 80. Core assembly 80 includes circuit board 82 that supports most of the working components of the receptacle, including the circuit shown in FIGS. 4A-4D, referred to herein as simply FIG. 4, sense transformer 84 and grounded neutral transformer 85 (not shown). Line contact arms 94, 96 pass through transformers 84, 85 with an insulating separator 98 therebetween. Line contact arms 94, 96 are cantilevered, their respective distal ends carrying phase and neutral line contacts 102, 104. Load contact arms 98, 100 are also cantilevered with their respective distal ends carrying phase and neutral load contacts 101, 103. The resiliency of the cantilevered contact arms biases the line contacts 102, 104 and load contacts 101, 103 away from each other. Load contact arms 98, 103 rest on a movable contact carriage 106, made of insulating (preferably thermoplastic) material.

FIG. 4 is a schematic drawing of the electrical and mechanical components of a GFCI receptacle device consistent with one or more of the exemplary embodiments of the present invention. The circuit shown in FIG. 4 can be employed in a GFCI device as described above with respect to various embodiments of the invention. The circuit of FIG. 4 is consistent with the mechanical operation of the exemplary embodiments described above; however, a GFCI device consistent with embodiments of the invention need not employ the precise electrical circuit depicted in FIG. 4 and those of ordinary skill in the art, after viewing FIG. 4 and/or reviewing the description set forth below, would be able to modify certain aspects of the circuit to achieve similar overall results. Such modifications are contemplated and believed to be within the scope of the invention set forth herein.

FIG. 4 is a schematic drawing of an electrical circuit in accordance with an exemplary embodiment of the invention. The circuit shown in FIG. 4, or various sub-circuits thereof, can be implemented in a variety electrical wiring devices, however, for purposes of description here the circuit of FIG. 4 is discussed in conjunction with its use in the GFCI receptacle device shown in FIGS. 1-3.

The circuit of FIG. 4 includes phase line terminal 326 and neutral line terminal 328 for electrical connection to an AC power source (not shown), such as a 60-hertz, 120 volt rms power source as used in the United States for mains power. The circuit of FIG. 4 and the software resident on and implemented therewith, can be modified to accommodate other power delivery systems as well. Such modifications and the resultant circuit and wiring device in which the circuit and software are would ultimately be used are contemplated by the inventor and considered to be within the spirit and scope of the invention described herein. For example, power delivery systems that use different voltages and frequencies are within the scope of the invention.

Referring to FIG. 4, phase conductor 330 and neutral conductor 332 are respectively connected to the phase and neutral line terminals and each pass through sense transformer 334 and grounded neutral transformer 336, which are part of a detection circuit described below. By way of example, phase and neutral line terminals correspond to input terminal screws 326, 328 in FIG. 1 above and phase and neutral line conductors 330, 332 represent line contact arms 94, 96, respectively, as described above with respect to FIG. 3. Each of line conductors 330, 332 has a respective fixed end connected to the phase and neutral line terminals and each includes a respective movable contact, e.g. contacts 102, 104 from the embodiment described above. Face phase and face neutral conductors 338, 340, respectively, include electrical contacts (not shown) fixed thereto. The face conductors are electrically connected to and, in the embodiment shown are integral with, respective face terminals 342, 344, to which plug blades from a load device (not shown), such as an electrical appliance, would be connected when the electrical receptacle device is in use.

The circuit shown in FIG. 4 according to this embodiment also includes optional load phase and load neutral terminals 346, 348, respectively, which electrically connect to a downstream load (not shown), such as one or more additional receptacle devices. Load terminals 346, 348 are respectively connected to cantilevered load conductors 277, 278, each of which includes a movable contact (not shown in FIG. 4) at its distal end. The load contacts are disposed below respective phase and neutral line contacts and phase and neutral face contacts and are coaxial with them such that when the line conductors are moved toward the load and face conductors, the three sets of contacts mate and are electrically connected together. When the device is in this condition it is said to be "reset" or in the reset state.

The Detector Circuit

With continued reference to FIG. 4, detector circuit 352 includes transformers 334, 336 as well as a GFCI integrated circuit device ("GFCI IC") 350. In accordance with the present embodiment GFCI IC 350 is the well-known 4141 device, such as an RV4141 device made by Fairchild Semiconductor Corporation. Other GFCI IC devices could also be used in the circuit of FIG. 4 instead of the 4141 and such a modification is within the spirit and scope of the invention.

GFCI IC device 350 receives electrical signals from various other circuit components, including transformers 334, 336, and detects one or more kinds of faults, such as a real fault, a simulated fault or self-test ground fault, as well as a real or simulated grounded neutral fault. For example, when a sufficient current imbalance in line conductors 330, 332 occurs, a net current flows through the transformers 334, 336, causing a magnetic flux to be created about at least transformer 334. This magnetic flux results in electrical current being induced on conductor 333, which is wound around sense transformer 334. Respective ends of conductor 333 are connected to the positive and negative inputs to the sense amplifier of GFCI IC device 350 at input ports V-REF and VFB, respectively. The induced current on conductor 333 causes a voltage difference at the inputs to the sense amplifier of GFCI IC 350. When the voltage difference exceeds a predetermined threshold value, a detection signal is generated at one or more of outputs of GFCI IC 350, such as the SCR trigger signal output port (SCR_OUT). The threshold value used by GFCI IC 350 is determined by the effective resistance connected between the op-amp output (OP_OUT) and the positive input to the sense amplifier ("VFB").

The current imbalance on line conductors 330, 332 results from either a real ground fault, a simulated ground fault or a self-test ground fault. A simulated ground fault is generated when test switch 354 in FIG. 4 closes, which occurs when TEST button 28 (FIG. 1) is pressed. As described in further detail below, a self-test fault occurs when auto-monitoring circuit 370 initiates an auto-monitoring test sequence that includes an electrical current being generated on independent conductor 356.

According to the present embodiment, when test switch 354 closes, some of the current flowing in line conductors 330, 332 and load conductors 338, 340 is diverted from the phase face conductor 338 (and phase load conductor 277 when the device is in the reset state) around sense transformer 334 and through resistor 358 to neutral line conductor 332. By diverting some of the current through resistor 358 in this manner, an imbalance is created in the current flowing through conductor 330 and the current flowing in the opposite direction through conductor 332. When the current imbalance, i.e., the net current flowing through the conductors passing through the sense transformer, exceeds a threshold value, for instance 4-5 milliamps, this simulated ground fault is detected by detector circuit 352 and the SCR output of GFCI IC 350 (SCR_OUT) is activated.

When the SCR output of GFCI IC 350 is activated, a switch 360 (e.g., an SCR) is triggered into the ON state or condition, which allows current to flow from the phase line conductor 330 through resistor 500 to an opto-coupler 505. The opto-coupler 505 isolates the trigger for switches 361 and 369 (e.g., SCRs) from mains power and a solenoid (e.g., dual solenoid coil 362 [described below]). Although the opto-coupler 505 is illustrated in FIG. 4, the opto-coupler can be replaced with a different solid-state relay in other constructions of the invention. For descriptive purposes, the switches 360, 361, and 369 will be described herein with respect to embodiments of the invention where each switch is an SCR. Following the SCR 360 being triggered into the ON condition or state, the opto-coupler 505 is triggered or activated into the ON condition or state and the opto-coupler 505 allows current to flow from pin 4 to pin 3 of the opto-coupler 505. A reverse-biased Zener diode 510 is connected across pins 1 and 2 of the opto-coupler 505 to protect the opto-coupler 505 from a power surge and/or transient voltage spikes. For example, if a voltage were applied across the Zener diode 510 that was greater than the reverse-biased breakdown voltage of the Zener diode 510 (e.g., 5V), the Zener diode 510 would conduct current in the reverse direction. Such an operation diverts current away from the opto-coupler 505.

A voltage supply output, VS, of GFCI IC 350 provides a voltage to resistor 515, which is connected to pin 4 of the opto-coupler 505. The current flowing through resistor 515 and pins 4 and 3 of opto-coupler 505 is operable to trigger or activate the gates of SCR 361 and SCR 369 into the ON condition or state. However, the resistor 515 is electrically connected to capacitors 520 and 525 through the opto-coupler 505 to create a resistor-capacitor ("RC") circuit 530. The RC time delay introduced by the RC circuit 530 delays the gates of SCR 361 and 369 from being triggered or activated into the ON state, and delays the device from tripping for an amount of time. In some embodiments the capacitors 520 and 525 can be replaced with a one capacitor. In other embodiments, more than two capacitors can be used to provide capacitors to the RC circuit 530.

Once the amount of time of the delay from the RC circuit 530 has elapsed, SCR 361 and SCR 369 are activated or triggered into the ON state. When SCR 361 is turned ON, current flows from phase line conductor 330 through secondary coil 363 of dual-coil solenoid 362, fuse 365, diode 367 and SCR 361. Further, when SCR 369 is turned ON, current flows from phase line conductor 330 through primary coil 364 of dual-coil solenoid 362, fuse 372, diode 374 and SCR 369. In some embodiments, only one of the SCR 361 and SCR 369 is implemented in the delay circuit, and the solenoid 362 includes one coil. The current flowing through both coils 363, 364 generates a magnetic field that moves an armature within solenoid 362. When the solenoid armature moves, it unlatches a contact carriage, (e.g., 106 in FIG. 3) which is part of interrupting device 315, and the carriage drops under the natural bias of line conductors 330, 332, that is, away from the face conductors 338, 340 and load conductors 277, 278. The device is now said to be "tripped," as a result of the successful manual simulated fault test sequence, and the device will not deliver power to a load until it is reset. The time it takes from the instant switch 354 closes until the device is tripped and current no longer flows from phase line conductor 330 to either the face and load conductors and through solenoid coils 363, 364, is so short that fuses 365, 372 remain intact.

The delay introduced by the RC circuit 530 delays the opening of the conductors 330, 332 such that the conductors are opened when there is less power (e.g., less than 100% VCC) being provided through the contacts of the interrupting device 315. For example, a delay in the firing of the SCR output of GFCI IC 350 that is introduced by capacitor 307 (described below) causes the SCR 360 to be triggered at approximately the peak power point of the input power on conductors 330, 332 (i.e., at approximately 90° within the AC waveform). When this occurs, the load at the interrupting device 315 can generate a significant amount of plasma when the contacts are opened, which can burn the contacts of the interrupting device 315. The RC circuit 530 is operable to delay the opening of the contacts of the interrupting device 315 until less power is being provided through the interrupting device 315. In some embodiments, the RC circuit introduces a delay that reduces the power being provided through the interrupting device 315 to between approximately 25% and approximately 100% VCC when the contacts are opened. In some embodiments, the interrupting device 315 is triggered when between approximately 50% and 65% VCC is being provided through the interrupting device 315. This reduced power through the interrupting device 315 when the contacts are opened reduces the amount of plasma that is generated. As a result, contacts that include less silver can be used (i.e., to lower costs), and the operational life of the contacts can be increased (e.g., by reducing the burning of the contacts by plasma).

Figure 5:
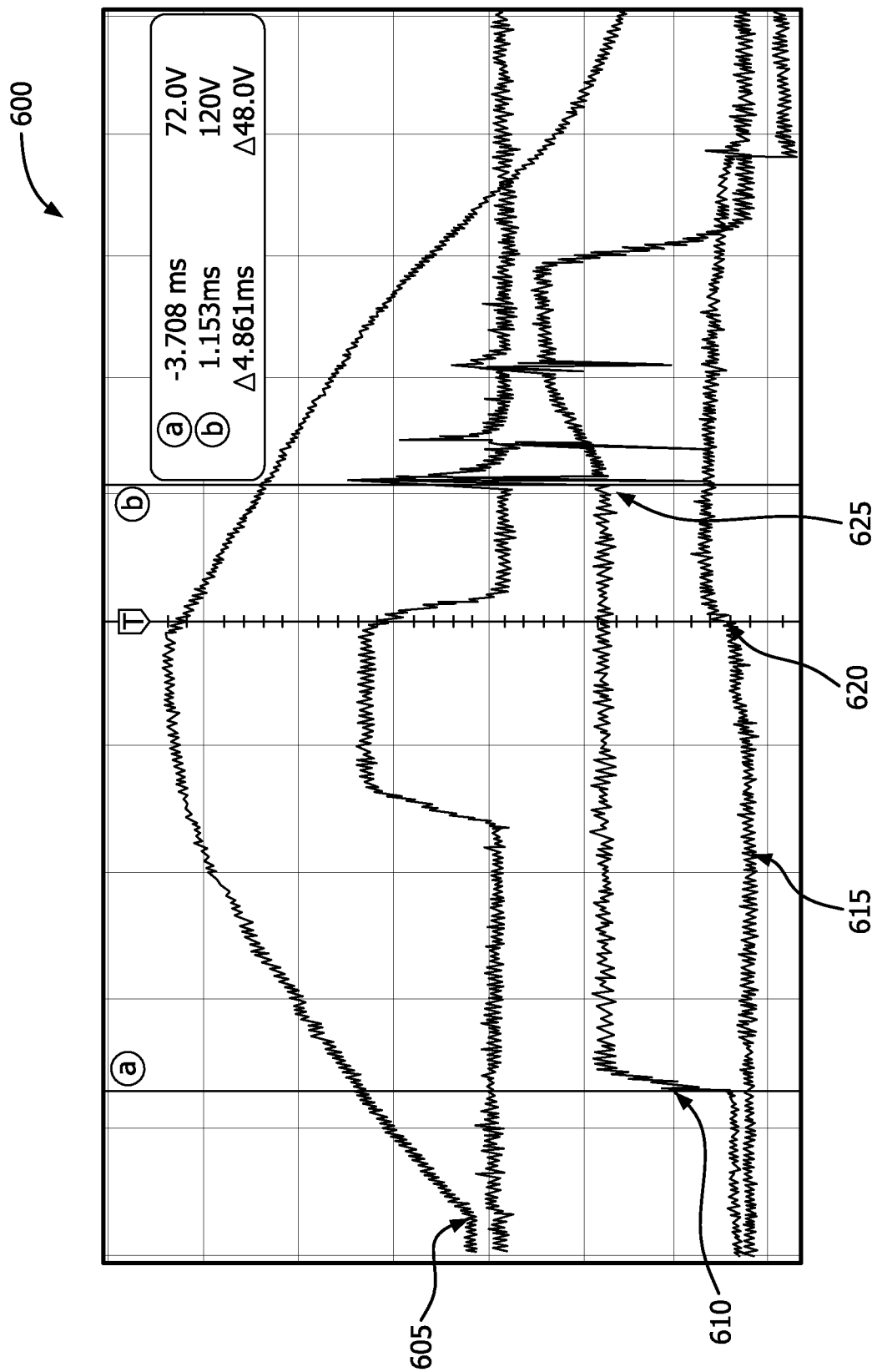
FIG. 5 is an oscilloscope trace that demonstrates how delaying the opening of the contacts of an interrupting device reduces the power being applied through the contacts of the interrupting device when the contacts are opened

FIG. 5 illustrates an oscilloscope trace 600 that demonstrates how delaying the opening of the contacts of the interrupting device 315 reduces the power through the interrupting device 315 when the contacts are opened. FIG. 5 illustrates the start of a positive half cycle of an AC waveform that is used to trip the device at 605. In this illustrative example, the resistor 515 has a value of 53 kOhms and the capacitors 520, 525 have values of 0.23 µF. The voltage at port GP3 of microcontroller 301 is used by the microcontroller 301 to determine whether or not the GFCI IC device 350 is being supplied with power, and whether the device is tripped or in the reset condition. The leading edge of the voltage at port GP3 is illustrated in FIG. 5 at 610. The delay in the firing of the SCR output of GFCI IC 350 that is introduced by capacitor 307 causes the SCR 360 to be triggered at 615. As illustrated in FIG. 5, the SCR 360 is triggered at approximately peak power (approximately 100% VCC). However, the RC circuit 530 prevents SCR 361 and SCR 369 from being triggered for approximately 1 mS until 620. After the SCR 361 and SCR 369 are triggered, a mechanical delay (described above) in the opening of the contacts of the interrupting device 315 delays the opening of the contacts until 625. A total delay of 4.86 mS from the leading edge of the voltage at GP3 (610) until the contacts of the interrupting device are actually opened (625) is achieved. The voltage of the positive half cycle of the AC waveform is 120V (85 volts rms) or approximately 68% VCC.

The embodiment of the invention illustrated graphically in FIG. 5 is provided for illustrative purposes and other values for the resistor 515 and capacitors 520 and 525 can be used that will increase or decrease the RC time delay introduced by the RC circuit 530. The RC delay from the RC circuit 530 can be increased (e.g., greater than approximately 1 mS) but there must be enough power present at the solenoid 362 to open the contacts of the interrupting device 315. The minimum power needed to open the contacts of the interrupting device 315 occurs at approximately 25% VCC for the illustrated AC waveform.

Manual Testing Via the Reset Operation

With reference once again to FIG. 4, closing reset switch 300, e.g., by pressing RESET button 24 (FIG. 1), also initiates a test operation. Specifically, when reset switch 300 closes, a voltage supply output, VS, of GFCI IC 350 is electrically connected to the gate of SCR 360 through conductor 308, thus, turning ON SCR 360. When SCR 360 is turned ON, current is drawn from line conductor 330 through diode 359 and SCR 360 and ultimately to ground. Similar to when SCR 360 is turned ON by pressing the TEST button, as discussed previously, turning ON SCR 360 by pressing the RESET button results in SCR 361 and SCR 369 also being turned ON following an RC time delay and current flowing through solenoid coils 363, 364. The current flowing through coils 363, 364 of solenoid 362 generates a magnetic field at the solenoid and the armature within the solenoid is actuated and moves. Under typical, e.g., non-test, conditions, the armature is actuated in this manner to trip the device, such as when an actual fault Occurs.

When reset switch 300 closes, however, the device is likely already in the tripped condition, i.e., the contacts of the line, face and load conductors are electrically isolated. That is, the RESET button is usually pressed to re-latch the contact carriage and bring the line, face and load contacts back into electrical contact after the device has tripped. If the armature of solenoid 362 fails to fire when the RESET button is pressed, and the reset mechanism, including the contact carriage, fails to engage the reset plunger on its return after the RESET button is released, the device will not reset. Accordingly, if, for example, the device has not been wired to the AC power lines, or it has been mis-wired, that is, the device has been wired with the AC power not connected to the line terminals, 326, 328, no power is applied to the GFCI IC 350. If no power is applied to GFCI IC 350, the gate of SCR 360 cannot be driven, either by the SCR output of GFCI IC 350 or when the REST button is pressed. Under this condition the device will not be able to be reset. The mis-wire condition is prevented in accordance with a wiring device consistent with the present embodiment by ensuring the device is shipped to the user in the tripped condition. Because the device cannot be reset until AC power is properly applied to the line terminals, the mis-wire condition is prevented.

The Auto-Monitoring Circuit

With continued reference to the exemplary circuit schematic shown in FIG. 4, auto-monitoring circuit 370 includes a programmable device 301. Programmable device 301 can be any suitable programmable device, such as a microprocessor or a microcontroller, which can be programmed to implement the auto-monitoring routine as explained in detail below. For example, according to the embodiment shown in FIG. 4, programmable device 301 is implemented by an ATMEL™ microcontroller from the ATtiny 10 family. It could also be implemented by a Microchip microcontroller such as a PIC10F204/206.

According to one exemplary auto-monitoring, or automatic self-testing, routine in accordance with the embodiment shown in FIG. 4, microcontroller 301 initiates the auto-monitoring routine approximately every three (3) seconds by setting a software auto-monitoring test flag. The auto-monitoring test flag initiates the auto-monitoring routine within the circuit interrupting device and confirms that the device is operating properly or, under certain circumstances, determines that the circuit interrupting device has reached its end-of-life ("EOL"). When the auto-monitoring routine runs with a positive, i.e., successful, result, the auto-monitoring circuit enters a hibernation state until microcontroller 301 sets the test flag again and initiates another auto-monitoring routine.

If the auto-monitoring routine runs with a negative result, e.g., it cannot be determined that the circuit interrupting device is functioning properly or it determines that it is, in fact, not operating properly, a failure counter is incremented and microcontroller 301 initiates another auto-monitoring routine when instructed by the software program stored in memory within the device. In addition to the failure count being incremented, a temporary indication of the failure is also provided. For example, according to the present embodiment, when such a failure occurs, I/O port GP0 of microcontroller 301 is controlled to be an output and light emitting diode ("LED") 376 is controlled to flash, e.g., one or more times, to indicate the failure to a user. If the failure counter reaches a predetermined value, i.e., the auto-monitoring routine runs with a negative result a certain number of times, the number being stored and implemented in software, the auto-monitoring routine invokes an end-of-life ("EOL") sequence. The EOL sequence includes one or more of the following functions; (a) indicate that EOL has been reached, for example, by continuously flashing or illuminating an indicator light and/or generating an audible sound, (b) attempt to trip the device, (c) prevent an attempt to reset the device, (d) store the EOL event on non-volatile memory, e.g., in the event there is a power failure, and (e) clear the EOL condition when the device is powered down.

In accordance with this embodiment, when the auto-monitoring software determines it is time to run the auto-monitoring routine, i.e., based on the auto-monitor timer, a stimulus signal 302 is turned ON at I/O port GP1 of microcontroller 301. When the stimulus signal is turned ON, electrical current flows through resistor 303 and a voltage is established at the base of transistor 304, turning the transistor ON. When transistor 304 is turned ON, current flows from dc voltage supply 378 through resistor 305, which is, for example, a 3 k-ohm resistor, and continues through electrical conductor 356 and transistor 304 to ground. Regarding dc voltage source 378, according to the present embodiment the value of this voltage source is designed to be between 4.1 and 4.5 volts dc, but the value of this voltage supply can be any other suitable value as long as the value used is adequately taken into account for other circuit functionality described below.

According to this exemplary embodiment, electrical conductor 356 is a wire, but it could also be a conductive trace on a printed circuit board. Conductor 356 is connected at one end to resistor 305, traverses through sense transformer 334 and is looped approximately ten (10) times around the core of the transformer and connected at its other end to the collector of transistor 304. Thus, when the software auto-monitoring test flag is set in microcontroller 301 and transistor 304 is turned ON, current flows through conductor 356 which comprises an independent conductor separate from phase line conductor 330 and neutral line conductor 332, which also traverse through the center of sense transformer 334.

If the circuit interrupting device according to the present embodiment is functioning properly, as current flows through conductor 356 and through the sense transformer a magnetic flux is generated at sense transformer 334. The flux generates a signal on conductor 333 which is detected by detection circuit 352, including GFCI IC device 350. In accordance with this embodiment, when device 350 detects the flux created at sense transformer 334, a voltage level is increased at one of the I/O ports of device 350, for example at the output port labeled CAP in FIG. 4, thus increasing the voltage on conductor 306.

According to this embodiment, capacitor 307 is connected between the CAP I/O port of microcontroller 301 and ground. As is known in the art, attaching a capacitor directly between the CAP output of a 4141 GFCI IC device and ground causes the SCR trigger signal (SCR_OUT) output from GFCI IC device 350 to be delayed by a predetermined period of time. The amount of time the trigger signal is delayed is typically determined by the value of the capacitor. According to the present embodiment, however, capacitor 307 is not connected directly between the CAP output and ground. Instead, capacitor 307 is also connected to the ADC I/O port GP0 of microcontroller 301 via a circuit path that includes diode 310 in series with resistor 311, e.g., 3 M-Ohm, which completes a voltage divider circuit with resistor 312, e.g., 1.5 M-Ohm. This additional circuitry connected to the capacitor at the CAP output of GFCI IC device 350 drains current from the delay capacitor.

By measuring the value of the signal at ADC I/O port (GP0) and confirming it is above a certain level, it can be determined whether or not the self-test fault signal generated on conductor 356 was properly detected by detection circuit 352 and it can further be confirmed whether GFCI IC device 350 is capable of generating the appropriate SCR trigger signal. Also, to avoid tripping the device during a self-test auto-monitoring fault, the voltage at capacitor 307 is measured and proper self-test fault detection is confirmed before a drive signal is output at SCR_OUT of GFCI IC device 350.

If the current drain on capacitor 307 is too high, GFCI IC device 350 may not operate properly. For example, if as little as 3-4 microamps of current is drained from capacitor 307, grounded neutral conditions, which are also intended to be detected by GFCI IC device 350, may not be accurately detected, e.g., pursuant to UL requirements, because the SCR trigger signal (SCR_OUT) will not fire within the necessary amount of time. According to the present embodiment, less than about 1.3 microamps, or about 5% of the specified delay current for the GFCI IC device 350, is drained for the ADC I/O port GP0 of microcontroller 301. This small current drain from capacitor 307 has no effect on the ability of the device to properly detect real ground faults and/or real grounded neutral faults.

According to this embodiment, approximately 50 nano-amps of current is drawn off of capacitor 307. Parallel resistors 311 and 312 connected to the ADC I/O port GP0 of microcontroller 301 create a 4.5 megaohm drain which limits the current pulled from capacitor 307 to a maximum of 1.0 microamp. GFCI IC device 350 uses approximately 40 microamps of current to generate the SCR trigger but microcontroller 301 only requires approximately 50 nano-amps to read the SCR trigger signal off of capacitor 307 before the SCR trigger signal is output from SCR_OUT. Accordingly, by selecting the proper value for capacitor 307, in conjunction with appropriate value selections for resistors 311 and 312, as well as diode 310, it is possible to maintain the correct delay for the SCR trigger signal (SCR_OUT) from GFCI IC device 350 and use the ADC in microcontroller 301 to measure the signal at ADC input (GP0) to determine whether the test signal on conductor 356 has been properly detected by detection circuit 352.

It should also be noted that in the embodiment shown in FIG. 4, LED 376 is also connected to ADC I/O port (GP0) of microcontroller 301. Accordingly, whether or not LED 376 is conducting or not will affect the drain on capacitor 307, as well as the delay of the SCR trigger signal and the ability of microcontroller 301 to properly measure the signal output from the CAP I/O port of GFCI IC device 350. Thus, in regard to the circuit shown in FIG. 4, LED 376 is selected such that it does not turn ON and begin conducting during the time microcontroller 301 is measuring the signal from the CAP output of GFCI IC device 350. For example, LED 376 is selected such that its turn-ON voltage is about 1.64 volts, or higher which, according to the circuit shown in FIG. 4, can be measured at I/O port GP0. Additionally, to prevent any signal adding to capacitor 307 when LED 376 is being driven, diode 310 is provided.

According to this embodiment, the circuit path that includes diode 310 and the voltage divider, 311, 312, is connected to I/O port GP0 of microcontroller 301, which serves as an input to an analog-to-digital converter ("ADC") within microcontroller 301. The ADC of microcontroller 301 measures the increasing voltage established by the charging action of capacitor 307. When a predetermined voltage level is reached, microcontroller 301 turns OFF the auto-monitoring stimulus signal 302 which, in turn, turns OFF transistor 304, stopping the current flow on conductor 356 and, thus, the flux created at sense transformer 334. When this occurs, it is determined by microcontroller 301 that a qualified auto-monitoring event has successfully passed and the auto-monitoring fail counter is decremented if the present count is greater than zero.

In other words, according to this embodiment an auto-monitoring routine is repeated by microcontroller 301 on a predetermined schedule. Based on the software program stored in memory within microcontroller 301, the auto-monitoring routine is run, as desired, anywhere from every few seconds to every month, etc. When the routine is initiated, the flux created at sense transformer 334 occurs in similar fashion to the manner in which flux would be created if either an actual ground fault had occurred or if a simulated ground fault had been manually generated, e.g., by pressing the TEST button as described above.

There is a difference, however, between an auto-monitoring (self-test) fault generated by the auto-monitoring routine and either an actual ground fault or a simulated fault generated by pressing the TEST button. When either an actual or simulated ground fault occurs, a difference in the current flowing in the phase and neutral conductors, 330 and 332, respectively, should be generated. That is, the current on conductor 330 should be different than the current on conductor 332. This differential current flowing through sense transformer 334 is detected by GFCI IC device 350, which drives a signal on its SCR_OUT I/O port to activate the gate of SCR 360 and turn it ON. When SCR 360 turns ON, current is drawn through coils 363, 364 which causes interrupting device 315 to trip, causing the contact carriage to drop which, in turn, causes the line, face and load contacts to separate from each other. Thus, current is prevented from flowing through phase and neutral conductors 330, 332 to the phase and neutral face terminals 342, 344, and the phase and neutral load terminals 346, 348, respectively.

In comparison, when the auto-monitoring routine is performed in accordance with the present invention, no differential current is created on the phase and neutral conductors 330, 332 and the interrupting device 315 is not tripped. Instead, during the auto-monitoring routine, the flux generated at sense transformer 334 is a result of current flowing through conductor 356, which is electrically separated from phase and neutral conductors 330, 332. The current generated on conductor 356 is present for only a brief period of time, for example, less than the delay time established by capacitor 307, discussed previously.

If the voltage established at the input to the ADC input (GP0) of microcontroller 301 reaches a programmed threshold value within this predetermined period of time during an auto-monitoring routine, it is determined that the detection circuit 352 successfully detected the current flowing through the core of sense transformer 334 and the auto-monitoring event is deemed to have passed. Microcontroller 301, thus, determines that detection circuit 352, including GFCI IC device 350, is working properly. Because the current flowing through sense transformer 334 during the auto-monitoring routine is designed to be substantially similar in magnitude to the differential current flowing through the transformer during a simulated ground fault, e.g., 4-6 milliamps, it is determined that detection circuit 352 would be able to detect an actual ground fault and provide the proper drive signal to SCR 360 to trip interrupter 315.

Alternatively, auto-monitoring circuit 370 might determine that the auto-monitoring routine failed. For example, if it takes longer than the predetermined period of time for the voltage at the ADC input at GP0 of microcontroller 301 to reach the given voltage during the auto-monitoring routine, it is determined that the auto-monitoring event failed. If this occurs, an auto-monitoring fail tally is incremented and the failure is indicated either visually or audibly. According to one embodiment, the ADC port (GP0) of microcontroller 301 is converted to an output port when an auto-monitoring event failure occurs and a voltage is placed on conductor 309 via I/O port GP0, which is first converted to a output port by the microcontroller. This voltage at GP0 generates a current on conductor 309 that flows through indicator LED 376 and resistor 380 to ground. Subsequently, ADC I/O port (GP0) of microcontroller 301 is converted back to an input port and remains ready for the next scheduled auto-monitoring event to occur.

According to this embodiment, when an auto-monitoring event failure occurs, indicator LED 376 illuminates only for the period of time when the I/O port is converted to an output and an output voltage is generated at that port; otherwise LED 376 remains dark, or non-illuminated. Thus, if the auto-monitoring routine is run, for example, every three (3) seconds, and an event failure occurs only a single time or sporadically, the event is likely to go unnoticed by the user. If, on the other hand, the failure occurs regularly, as would be the case if one or more of the components used in the auto-monitoring routine is permanently disabled, indicator LED 376 is repetitively turned ON for 10 msec and OFF for 100 msec by microcontroller 301, thus drawing attention to the device and informing the user that critical functionality of the device has been compromised. Conditions that cause the auto-monitoring routine to fail include one or more of the following, open circuited differential transformer, closed circuited differential transformer, no power to the GFCI IC, open circuited solenoid, SCR trigger output of the GFCI IC continuously high, and SCR output of the GFCI IC continuously low.

According to a further embodiment, if the auto-monitoring fail tally reaches a predetermined limit, for example, seven (7) failures within one (1) minute, microcontroller 301 determines that the device is no longer safe and has reached its end-of-life (EOL). If this occurs, a visual indicator is activated to alert the user that the circuit interrupting device has reached the end of its useful life. For example, when this EOL state is determined, the ADC I/O port (GP0) of microcontroller 301 is converted to an output port, similar to when a single failure is recorded as described above, and a signal is either periodically placed on conductor 309 via GP0, i.e., to blink LED 376 at a rate of, for example, 10 msec ON and 100 msec OFF, or a signal is continuously placed on conductor 309 to permanently illuminate LED 376. The auto-monitoring routine is also halted at this time.

In addition to the blinking or continuously illuminated LED 376, according to a further embodiment when EOL is determined, an optional audible alarm circuit 382 on printed circuit board ("PCB") 390 is also activated. In this situation the current through LED 376 establishes a voltage on the gate of SCR 384 such that SCR 384 is turned ON, either continuously or intermittently, in accordance with the output signal from GP0 of microcontroller 301. When SCR 384 is ON, current is drawn from phase line conductor 330 to activate audible alarm 386 (e.g., a buzzer) providing additional notice to a user of the device that the device has reached the end of its useful life, i.e., EOL. For example, with respect to the present embodiment, audible alarm circuit 382 includes a parallel RC circuit including resistor 387 and capacitor 388. As current is drawn from phase line conductor 330, capacitor 388 charges and discharges at a rate controlled by the value of resistor 387 such that buzzer 386 sounds a desired intermittent alarm.

A further aspect of this embodiment includes dimmable LED circuit 396. Circuit 396 includes transistor 398, LEDs, 400, 402, light sensor 404 (e.g., a photocell) and resistors 406-408. When the ambient light, e.g., the amount of light in the vicinity of the circuit interrupting device according to the present embodiment, is rising, light sensor 404 reacts to the ambient light level to apply increasing impedance to the base of transistor 398 to dim the LEDs as the ambient light increases. Alternatively, when the ambient light decreases, e.g., as night begins to fall, the current flowing through sensor 404 increases, accordingly. As the ambient light level decreases, LEDs 400 and 402 illuminate brighter and brighter, thus providing a controlled light level in the vicinity of the device.

A further embodiment of the invention shown in FIG. 4 includes a mechanism for providing microcontroller 301 with data related to whether the device is tripped or in the reset condition. As shown in FIG. 4, opto-coupler 392 is connected between phase and neutral load conductors 277, 278 and I/O port (GP3) of microcontroller 301. Microcontroller 301 uses the value of the signal (voltage) at port GP3 to determine whether or not GFCI IC device 350 is being supplied with power and whether the device is tripped or in the reset condition. When GFCI IC device 350 is powered, e.g., via its voltage input port (LINE), which occurs when AC power is connected to line terminals 326, 328, a voltage is generated at the output port (VS). This voltage is dropped across Zener diode 394, which is provided to maintain the voltage supplied to the microcontroller within an acceptable level. Diodes 366, 368, connected between the phase line conductor and power supply input port (LINE) of GFCI IC 350 ensures that the voltage level supplied to GFCI IC and the VS output remain below approximately 30 volts. The voltage signal dropped across Zener diode 394 is connected to input port GP3 of microcontroller 301. If microcontroller 301 does not measure a voltage at GP3, it determines that no power is being supplied by GFCI IC device 350 and declares EOL.

Alternatively, if microcontroller 301 measures a voltage at GP3, it determines whether the device is tripped or in the reset state based on the value of the voltage. For example, according to the circuit in FIG. 4, if the voltage at GP3 is measured to be between 3.2 and 4.0 volts, e.g., between 76% of VCC and 100% of VCC, it is determined that there is no power at the face (342, 344) and load (346, 348) contacts and, thus, the device is in the tripped state. If the voltage at GP3 is between 2.4 and 2.9 volts, e.g., between 51% of VCC and 74% of VCC, it is determined that there is power at the face and load contacts and the device is in the reset state.

According to a further embodiment, when EOL is determined, microcontroller 301 attempts to trip interrupting device 315 in one or both of the following ways: (a) by maintaining the stimulus signal on third conductor 356 into the firing half-cycle of the AC wave, and/or, (b) by generating a voltage at an EOL port (GP2) of microcontroller 301. When EOL has been declared, e.g., because the auto-monitoring routine fails the requisite number of times and/or no power is being supplied from the supply voltage output (VS) of GFCI IC device 350, microcontroller 301 produces a voltage at EOL port (GP2). Optionally, microcontroller 301 can also use the value of the input signal at GP3, as described above, to further determine whether the device is already in the tripped state. For example, if microcontroller 301 determines that the device is tripped, e.g., the load and face contacts are not electrically connected to the line contacts, microcontroller 301 may determine that driving SCR 369 and/or SCR 361 in an attempt to open the contacts and trip the device is unnecessary and, thus, not drive SCR 369 and SCR 361 via GP2.

The voltage at GP2 directly drives the gate of SCR 369 and/or SCR 361 to turn SCR 369 and/or SCR 361 ON, thus, enabling it to conduct current and activate solenoid 362. More specifically, when SCR 369 and/or SCR 361 are turned ON, current is drawn through coil 364 of dual coil solenoid 362. For example, dual coil solenoid 362 includes inner primary coil 364, which comprises an 800 turn, 18 Ohm, 35 AWG coil, and outer secondary coil 363, which includes a 950 turn, 16.9 Ohm, 33 AWG coil. Further details of the construction and functionality of dual coil 362 can be found in U.S. patent application Ser. No. 13/422,797, which published as U.S. patent publication 2013-0241675, and is assigned to the same assignee as the present application, the entire contents of which are incorporated herein by reference for all that is taught.

As described above, when it is determined via the auto-monitoring routine that detection circuit 352 is not successfully detecting ground faults, e.g., it does not detect the flux resulting from current flowing in conductor 356, or it is not otherwise generating a drive signal at the SCR_OUT output port of GFCI IC device 350 to drive the gate of SCR 360 upon such detection, microcontroller 301 determines EOL and attempts to trip interrupting device 315 by methods mentioned above. Specifically, microcontroller 301 attempts to directly trip directly driving the primary coil 364, by the back-up path GP2 to SCR 369 and SCR 361. There is at least one difference, however, between the signal on conductor 356 when the auto-monitoring routine is being run normally, and the signal on conductor 356 generated when EOL is determined. That is, under EOL conditions, GP2 energizes both SCR 361 and SCR 369 to be triggered and coil 362 and coil 363 to be energized, thus activating solenoid 362 and 369 to trip interrupting device 315.

If interrupting device 315 is opened, or if interrupting device 315 was otherwise already open, power-on indicator circuit 321 will be OFF. For example, in the embodiment shown in FIG. 4, power-on indicator circuit 321 includes LED 322 in series with resistor 323 and diode 324. The cathode of LED 322 is connected to the neutral load conductor 278 and the anode of diode 324 is connected to phase load conductor 277. Accordingly, when power is available at the load conductors, that is, the device is powered and in the reset state, current is drawn through the power-on circuit on each alternating half-cycle of AC power, thus, illuminating LED 322. If, on the other hand, power is not available at the load conductors 277, 278, for example, because interrupting device 315 is open, or tripped, or the device is reset but no power is being applied, LED 322 will be dark, or not illuminated.

Additional embodiments and aspects thereof, related to the auto-monitoring functionality consistent with the present invention, as well as further discussion of some of the aspects already described, are provided below.

The sinusoidal AC waveform discussed herein is connected to the phase and neutral line terminals 326, 328 when the self-test GFCI device is installed correctly. According to one embodiment the AC waveform is a 60 Hz signal that includes two half-cycles, a positive 8.333 millisecond half-cycle and a negative 8.333 millisecond half-cycle. The so-called "firing" half-cycle refers to the particular half-cycle, either positive or negative, during which a gate trigger signal to SCR 360 results in the respective gates of SCR 361 and SCR 369 being driven and the corresponding respective solenoid coils 363, 364 conducting current, thus, "firing" solenoid 362 and causing the armature of the solenoid to be displaced. A "non-firing" half-cycle refers to the alternate half-cycle of the AC waveform, i.e., either negative or positive, during which current does not flow through the SCR or its respective solenoid coil, regardless of whether or not the SCR gate is triggered. According to the present embodiment, whether the positive or negative half-cycle is the firing half-cycle is determined by a diode, or some other switching device, placed in series with the respective solenoid coil. For example, in FIG. 4, diodes 359, 374 and 367 are configured such that the positive half-cycle is the "firing" half-cycle with respect to SCRs 360, 369 and 361, respectively.

According to a further embodiment of a circuit interrupting device consistent with the invention, microcontroller 301 optionally monitors the AC power input to the device. For example, the 60 Hz AC input that is electrically connected to the phase and neutral line terminals 326, 328 is monitored.

More particularly, a full 60 Hz AC cycle takes approximately 16.333 milliseconds to complete. Thus, to monitor and confirm receipt and stabilization of the AC waveform, a timer/counter within microcontroller 301 is implemented. For example, within the three (3) second auto-monitoring window the 60 Hz input signal is sampled once every millisecond to identify a leading edge, i.e., where the signal goes from negative to positive values. When a leading edge is detected a flag is set in the software and a count is incremented. When the three (3) second test period is finished, the count result is divided by 180 to determine whether the frequency is within a specified range. For example, if the frequency is stable at 60 Hz, the result of dividing by 180 would be 1.0 because there are 180 positive edges, and 180 cycles, in three (3) seconds worth of a 60 Hz signal. If the frequency is determined to not be within a given range, for example, 50-70 Hz, the auto-monitoring self-test fault testing is stopped, but the monitoring of GP3 continues. Accordingly, a premature or errant power failure determination is avoided when a circuit interrupting device in accordance with the invention is connected to a variable power source, such as a portable generator, and the power source exhibits a lower frequency at start-up and requires a stabilization period before the optimal frequency, e.g., 60 Hz, is achieved.

If the frequency is not stable at the optimal frequency, or at least not within an acceptable range, initiation of the auto-monitoring routine is delayed until the frequency is stabilized. If the frequency does not achieve the optimal frequency, or a frequency within an acceptable range, within a predetermined time, a fail tally is incremented. Similar to the fail tally discussed previously with respect to the auto-monitoring routine, if the tally reaches a given threshold, microcontroller 301 declares EOL.

As described above, according to at least one exemplary embodiment, programmable device 301 is implemented in a microcontroller. Because some microcontrollers include non-volatile memory, e.g., for storing various data, etc., in the event of a power outage, according to a further embodiment, all events, timers, tallies and/or states within the non-volatile memory are cleared upon power-up of the device. Accordingly, if the fail tally or other condition resulted from, improper device installation, inadequate or improper power, or some other non-fatal condition with respect to the circuit interrupting device itself, the fail tally is reset on power-up, when the tally incrementing event may no longer be present. Another way of avoiding this potential issue in accordance with the invention is to utilize a programmable device that does not include non-volatile memory.

Figure 6A:
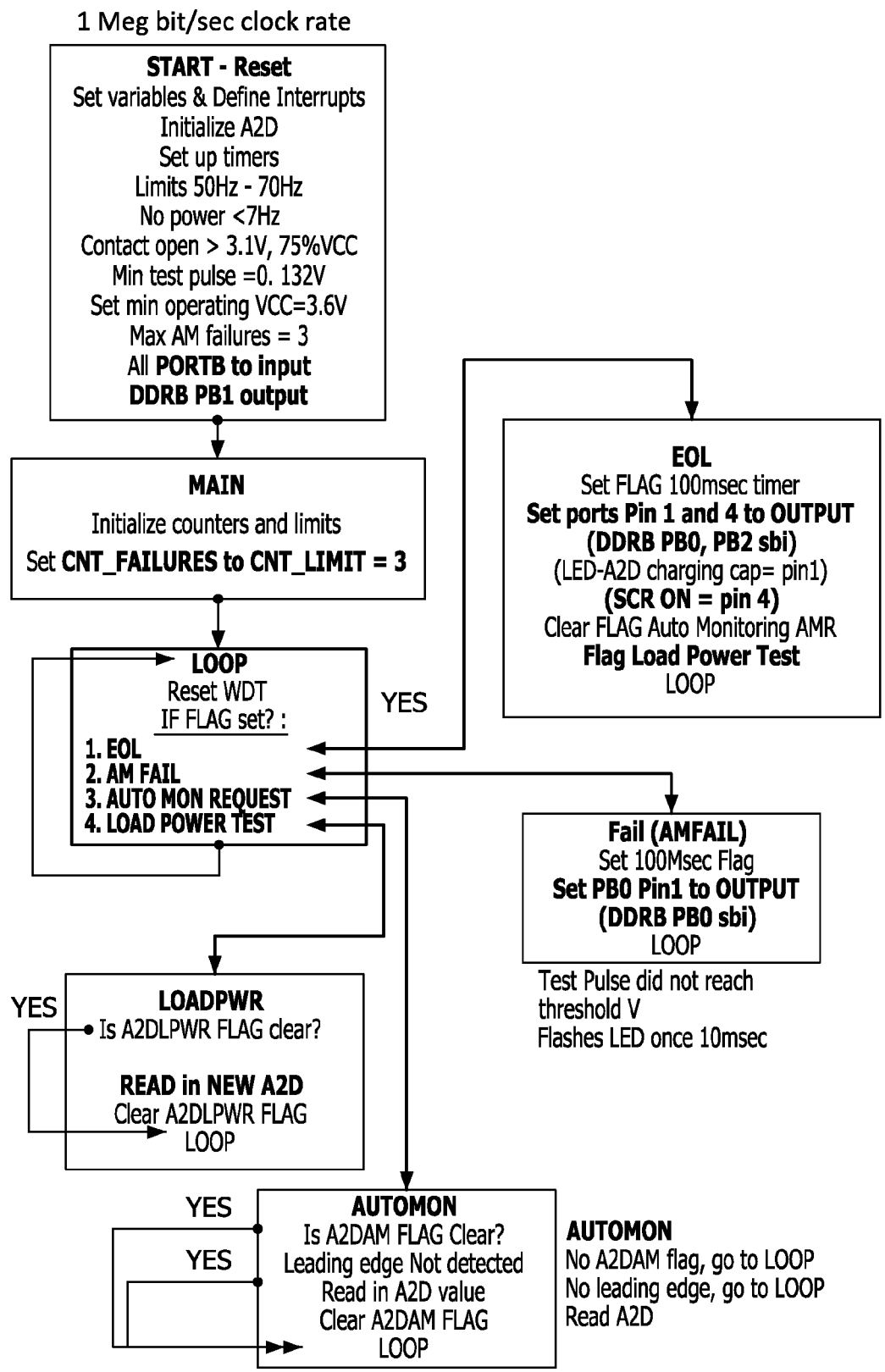
FIG. 6A is a portion of a system level flow diagram illustrating the operations of the software code in accordance with an exemplary embodiment of the present invention.

FIGS. 6A-6H3 and 7 are respective system level flow diagrams representing the functionality of a software program consistent with an embodiment of the present invention. For example, in accordance with an embodiment of the invention software code based on the flow diagrams of FIGS. 6A through 6H3 is programmed, e.g., stored in memory, in microcontroller 301, described above in accordance with a hardware implementation of a wiring device with self-testing and auto-monitoring capabilities. The program includes the auto-monitoring routine described above and all the attendant processing and reporting functions related thereto and also described above.

More particularly, as shown in FIG. 7, in accordance with at least one embodiment the program begins by performing some basic start-up functions, including resetting and initializing various registers and variables used by the program code during processing. The program further calls various sub-routines, as needed, to implement the self-testing and auto-monitoring functions of the wiring device described above. The box towards the left side of FIG. 7 is a map of the resets that occur periodically in accordance with a predetermined schedule, for example, every 1 msec. Further, according to this embodiment the processor (e.g., within microcontroller 301 in the above embodiments) is clocked at an operating frequency of 4 MHz and each instruction is running at 1 microsecond. Accordingly, one thousand (1000) instructions occur between each interrupt.

FIGS. 6A through 6H3 provide certain details of the functionality of the software program according to this embodiment and one of skill in the art would understand and be able to interpret the various assembly language nomenclature used. The nomenclature provided identifies the specific instructions carried out in the software within the microcontroller. The instructions used in the embodiment of FIGS. 6A-6H3 and 7 are associated with the instruction set of the ATtiny 10 microcontroller by ATMEL®. Those skilled in the art will understand that other microcontrollers and, thus, other instruction sets, can be used to carry out the functionality described herein without departing from the intended scope of this disclosure.

The description provided below with respect to each of FIGS. 6A through 6H3 is intended to provide a broad overview of the functionality of the software program according to this embodiment.

As shown in FIG. 6A the code begins at START which immediately resets, initializes and enables various variables and activates the input/output (I/O) ports of the microcontroller before the MAIN routine is called. Further details of the START and MAIN routines are illustrated in FIG. 6H1-6H3, also referred to collectively as FIG. 6H, which is described below.

Referring to FIG. 6H, which represents the RESET function depicted in FIG. 7, the stack pointer is set to point to the beginning of the program stored in memory. Different variables representing various voltage levels, counter values, flags, etc. are then cleared or initialized to values determined previously through testing to be ideal for operation of the wiring device in accordance with design rules and requirements set by outside organizations, such as United Laboratories (UL) mentioned above. For example, the software code according to the present embodiment ensures operation of the wiring device to be compliant with standard UL-943, including recent self-testing and auto-monitoring requirements. One of skill in the art would know that certain constants, limits and other values depicted in FIGS. 6A through 6H3 can be changed or otherwise adjusted to accommodate different requirements, such as changes in UL-943, and/or changes to accommodate different line voltages attendant with power grids of jurisdictions other than the United States.

FIG. 6H also illustrates that the code initializes different timing variables that enable the code to operate different processing functions at different timing requirements. The code first checks the voltage (Vcc) level, initializes the watch dog timer, activates the various I/O ports of the microcontroller, initializes variable PCINT3, which is used for detecting edges of the line input voltage signal to, for example, determine the frequency of the line-in power signal.

The analog-to-digital (A2D) converter in the microcontroller is then initialized followed by the setting and enabling of certain other variables. The code then initializes three variables, CNT10 ms, CNT100 ms and CNT3 sec, to respective beginning values for a 10 millisecond timer, 100 millisecond timer and a 3 second timer. Different routines and functions carried out pursuant to the code are performed in accordance with these three timing windows. After the software resets and initializes the necessary values, as shown in FIG. 6H, the code returns to LOOP in FIG. 6A and continuously loops until the next 1 msec interrupt occurs.

Referring to FIG. 6A, the watchdog timer (WDT) is reset and then it is checked whether the end-of-life (EOL) flag has been set. If so, software variables (PB0 and PB2) are set to configure the appropriate I/O port (GP0) of the microcontroller to output a signal to illuminate the LED (376) and trigger the SCR (369), respectively. Further auto-monitoring routines are disabled. The LOOP routine then checks if an auto-monitoring failure (AMFAIL) flag has been set and, if so, sets variable (PB0) to configure I/O port (GP0) to be an output port. Then the LOOP routine checks whether an auto-monitoring request (AUTOMON) includes an A2DAM Flag clear and whether a leading edge was not detected. If the flag is clear and/or no edge is detected, the AUTOMON routine returns to the LOOP routine. If neither condition is met, the test value is read and the A2DAM flag is cleared. The AUTOMON routine then returns to the LOOP routine. The LOOP routine also checks the LOADPWR routine, which determines whether the A2DLPWR flag is clear. If so, LOADPWR routine returns to the LOOP routine. If not, a new value of the input signal is read by the analog-to-digital (A2D) converter, the A2DLPWR flag is cleared and a return to the LOOP routine occurs.

Figure 6B:
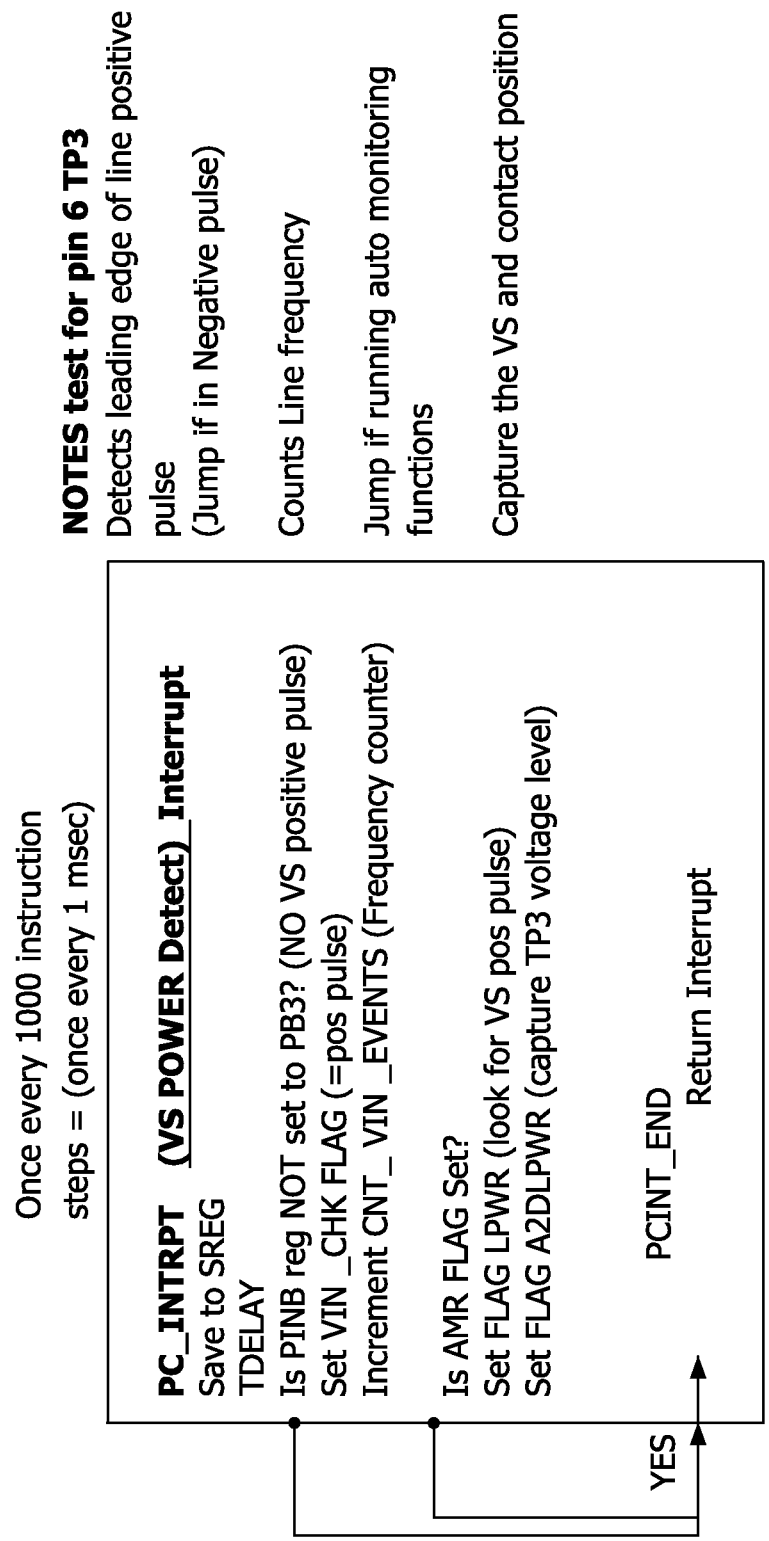
FIG. 6B is a further portion of the system level flow diagram referenced in FIG. 6A illustrating the operations of the software code in accordance with an exemplary embodiment of the present invention.

Referring to FIG. 6B, once every 1000 instructions, or 1 msec., the code calls routine PC_INTRPT which reads the VS signal at GP3 of the microcontroller to determine the leading edge of the signal. For example, by detecting the leading edge of the power signal the code determines the frequency (e.g., 60 Hz) of the input voltage signal and also determines whether the current signal is in a positive or negative half-cycle of the AC power signal.

Referring to FIG. 6D1-6D2, also referred to collectively as FIG. 6D, the code runs the various functions attendant with the different timers, i.e., TIM0_COMPA, TIM0.sub.-100 ms and TIM0_LED 100 ms. In TIM0_COMPA, which corresponds to the 1 msec. timer, timing for the auto-monitor routine is controlled. That is, the auto-monitoring routine is controlled to run every 3 seconds this timer keeps track of this timing. TIM0_CONT is the 10 msec. timer and, as shown in FIG. 6D, during this routine the LED (376) associated with the EOL condition is turned ON and OFF (blinking) for the appropriate amount of time, e.g., 10 ms ON and 100 ms OFF. The LED is also controlled to be OFF completely, as appropriate. Also, port GP0 is controlled to be an input or output, for example, an input if an EOL condition is not present and vice-versa.

Routine TIM0.sub.-100 ms, i.e., for the 100 msec. counter, the timing for the LED is further controlled, for example, the 100 msec. OFF time as mentioned above. The I/O port (GP1) for the LED drive signal is also controlled.

Figure 6C:
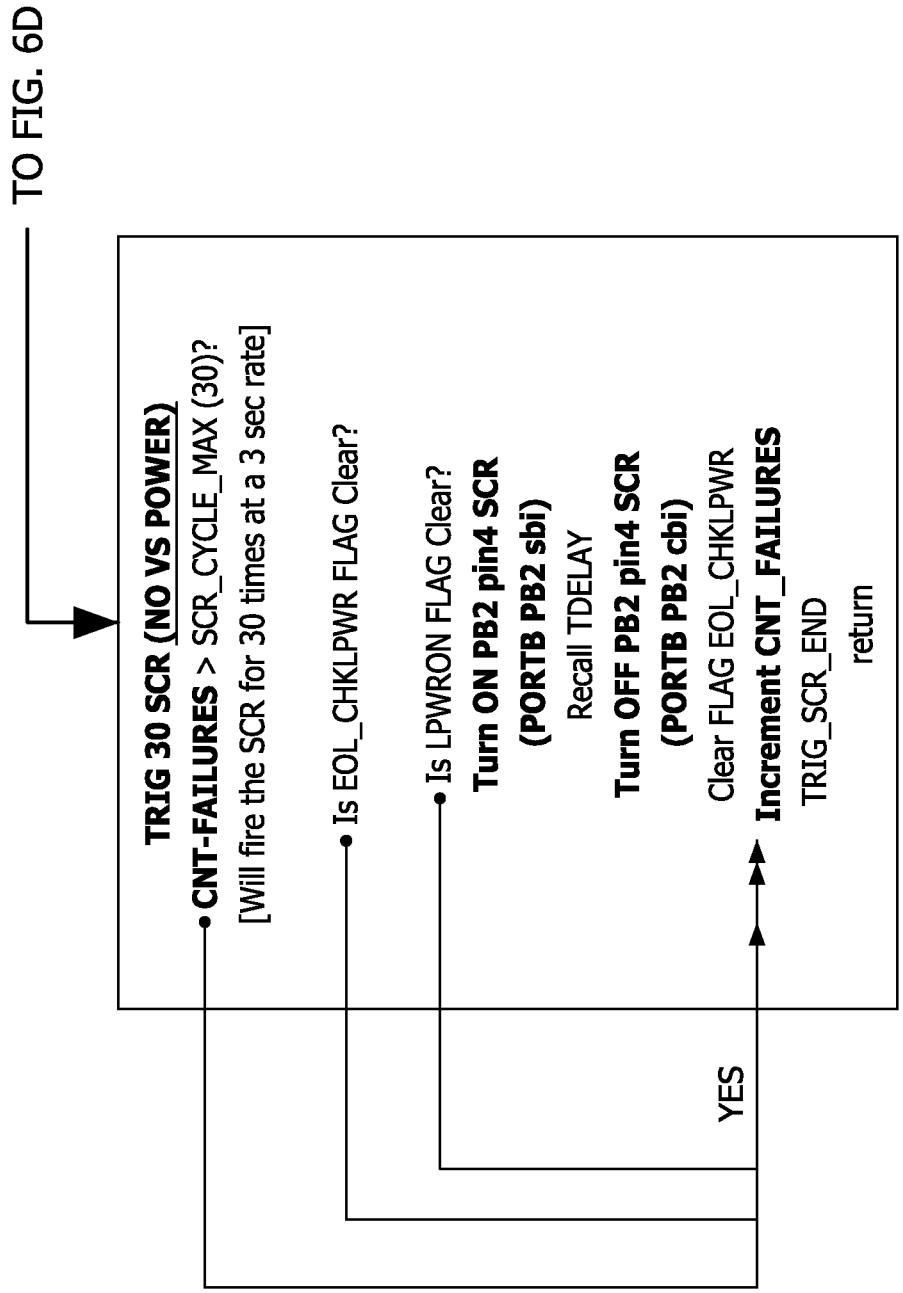
FIG. 6C is a further portion of the system level flow diagram referenced in FIG. 6A illustrating the operations of the software code in accordance with an exemplary embodiment of the present invention.

Referring still to FIG. 6D routine TIM0_LED 100 ms corresponds to the 3 second timer and the functions pursuant thereto. During this routine the test pulses (self-test faults) and the EOL set and clear processes are performed. For example, one of the functions performed during this routine is that the A2D multiplexer (MUX) within the microcontroller is controlled such that the signal on input port GP0 is processed by the A2D. Accordingly, when GP0 is an input port and the A2D measures the signal, it is measuring the value of the pre-trigger signal discussed above. Additionally, if no power (VS from the GFCI IC device) is detected or measured the code calls a separate routine to activate the gate of the SCR and fire the SCR 30 times. The details of the SCR firing routine are provided in FIG. 6C. FIG. 6D also includes routines TIM0_EOL which resets the frequency counters, and TIM0_DONE, which synchronizes the hardware to software clock rates. The TIM0_DONE routine is called at the start of both the TIM0.sub.-100 ms and TIM0_LED 100 ms routines.

Figure 6E:
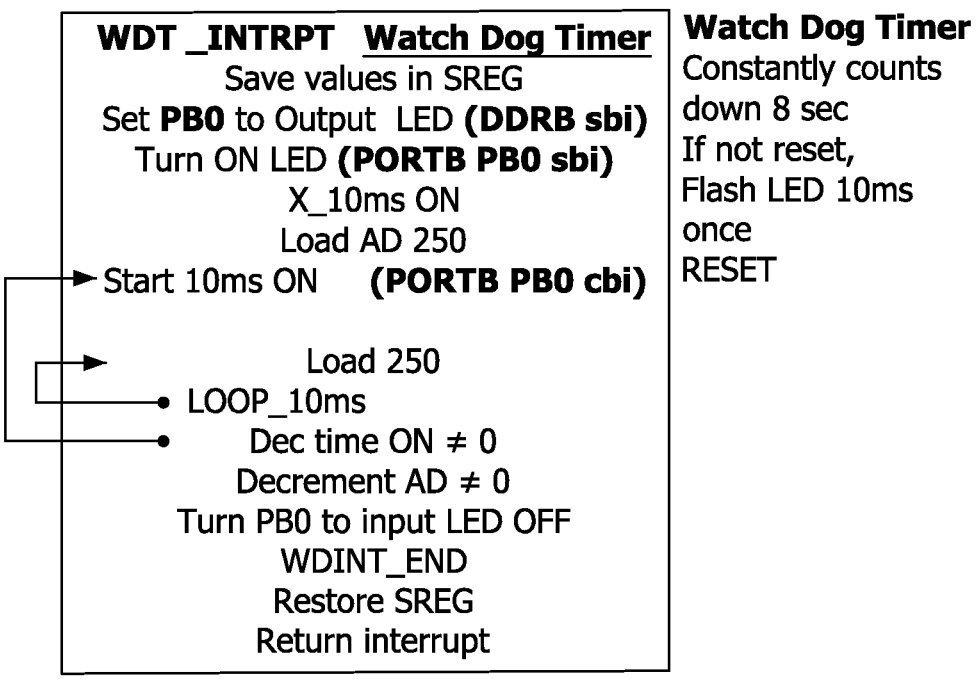
FIG. 6E is a further portion of the system level flow diagram referenced in FIG. 6A illustrating the operations of the software code in accordance with an exemplary embodiment of the present invention.

Referring to FIG. 6E, the WDT_INTRPT, the watch dog timer (WDT) constantly counts down 8 seconds. If the timer is not reset this routine controls GP0 to be an output and asserts a signal at this port to turn ON the LED (376) to indicate EOL.

Figure 6F:
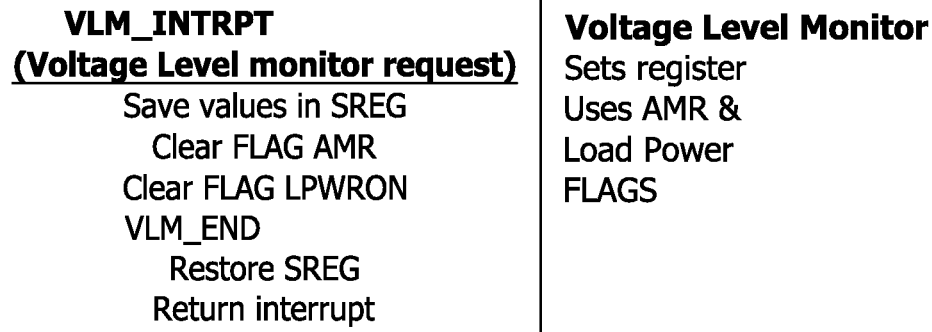
FIG. 6F is a further portion of the system level flow diagram referenced in FIG. 6A illustrating the operations of the software code in accordance with an exemplary embodiment of the present invention.

FIG. 6F illustrates routine VLM_INTRPT. This routine runs once every 1000 instruction steps, i.e., every 1 msec., and represents the voltage level monitoring function. During this routine certain flags are checked and, for example, if it is no longer desired to measure the power signal, that is, the VS signal from the GFCI IC device and the contacts open or closed signal from the opto-coupler, as described above.

Figure 6G:
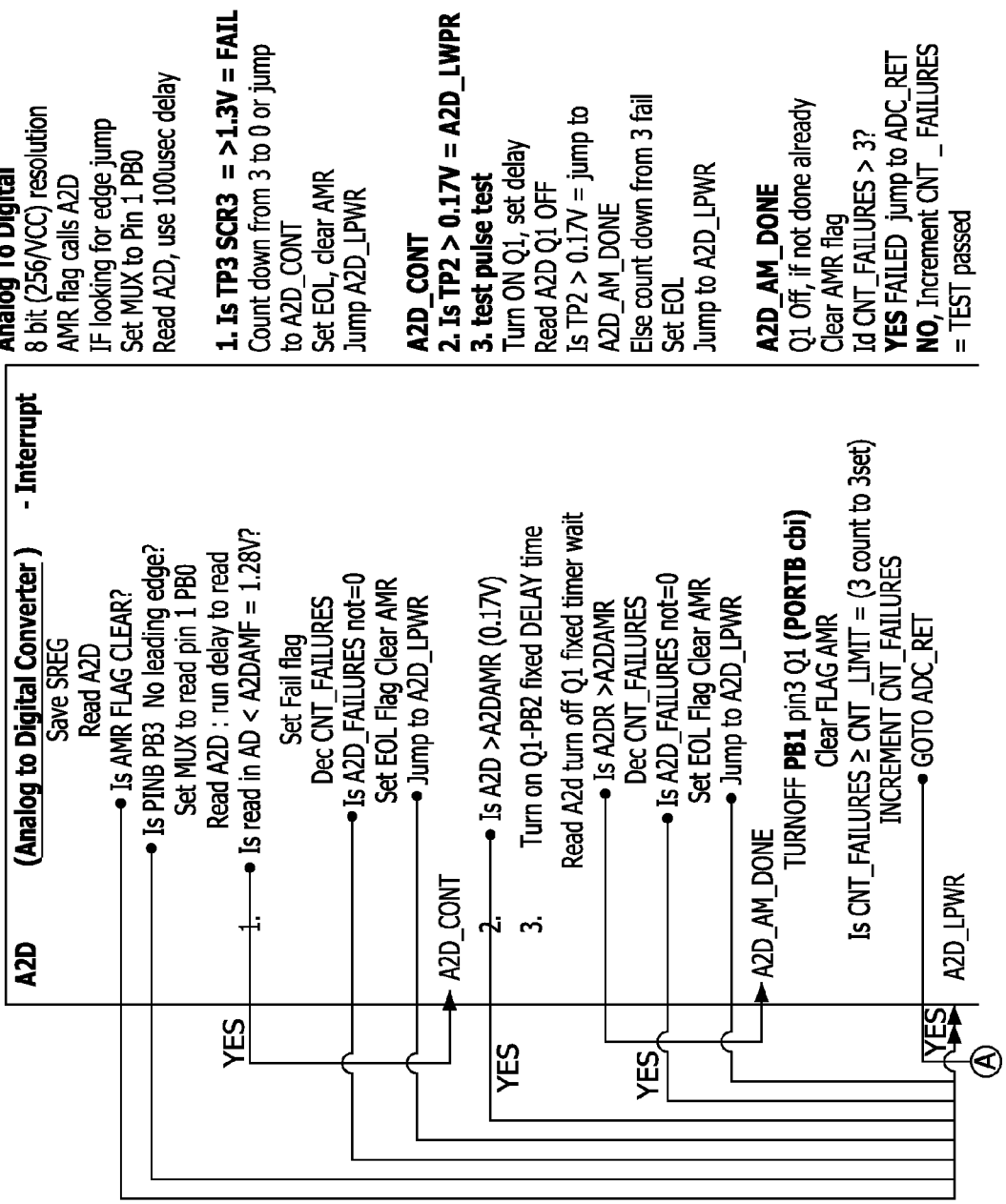

Referring to FIG. 6G, the A2D routine is executed. During this routine the result of the A2D converter in the microcontroller is read and if there was an automonitoring request, the value is checked to see if there is a failed SCR, e.g., is the voltage above 1.28 volts. If a failed SCR is determined a counter is decremented. If the counter gets to zero an End-of Life (EOL) Flag is set and the AMR is cleared. Thereafter, the controller 301 advances to the subroutine A2D_LPWR.

When there is not a failed SCR determined by the A2D routine shown in FIG. 6G as the voltage of the A2D result is above 1.28 volts, the A2D routine continues and then determines if the A2D result is greater than 0.17 volts. If so, the controller advances to the subroutine A2D_LPWR.

In the instance that the result of the A2D converter is not greater than 0.17 volts, Q1-PB2 is powered on for a set time. Then a test voltage is read by the A2D converter to obtain a new result and Q1-PB2 is powered off. If the A2D result is greater than 0.17 volts, the routine jumps to routine A2D_AM_DONE whereat the PB1 pin is turned off and the AMR flag is cleared. The routine advances to ADC_RET.

As shown in FIG. 6G1-6G2, also referred to collectively as FIG. 6G, when, after powering Q1 for a set time, the A2D result is not greater than 0.17 volts, the routine decrements a counter that indicates a voltage failure. The number of decremented failures is compared with zero. If zero is not the value, the routine advances to the subroutine A2D_LPWR. If, however, after a number of interrupts and passes through the routine wherein the decrementing occurs and the zero value is obtained, the EOL Flag is set and the AMR is cleared. Thereafter, the routine advances to A2D_LPWR. Thus, a low voltage for the A2D result must occur a predetermined number of times to avoid setting of the EOL Flag in response to an erroneous measurement. Therefore, reliability of the system is improved as false failure indications are minimized.

The A2D_LPWR subroutine shown in FIG. 6G and disclosed above, determines the state of the load contacts via the opto-coupler. More specifically, the A2D_LPWR subroutine looks for positive voltage pulses on pin 5 and determines if the voltages are greater than 3.6 volts on VCC. If the test fails a LPWRON flag is set. If the test fails three sets of three second tests, the SCR is triggered.

Thus, the invention provides, among other things, a microcontroller and circuitry that execute to periodically test a GFCI device.

While various embodiments have been chosen to illustrate the invention, it will be understood by those skilled in the art that other modifications may be made without departing from the scope of the invention as defined by the appended claims.

What is claimed is:

1. A recordable medium on which software code is stored, the software code comprising:
   code for auto-monitoring an electrical wiring device; code for monitoring a test signal output from a fault detection circuit to determine an operational state of the electrical wiring device; code for determining an end-of-life state if the test signal from the fault detection circuit is less than a threshold value a first predetermined number of times within a first predetermined time period; and code for generating an alarm signal when the end-of-life state is determined.

2. The recordable medium recited in claim 1, including a programmable circuit device, and wherein the code for determining an end-of-life state determines an end-of-life state when the test signal from the fault detection circuit is greater than a maximum threshold value a second predetermined number of times within a second predetermined time period.

3. The recordable medium recited in claim 1, wherein the software code further comprises:
   code for monitoring an output signal from a contacts sensing device; and code for determining whether the electrical wiring device is in a tripped state in which an AC power signal is prevented from being delivered to a load, or in a reset state in which the AC power signal is delivered to the load based on the output signal from the contacts sensing device.

4. The recordable medium recited in claim 2, wherein the software code further comprises:
   code for determining, in the programmable circuit device, a frequency associated with the AC power signal based on an evaluation of the test signal; code for delaying the auto-monitoring program if the frequency associated with the AC power signal is not stable; and code for incrementing a fail tally if the frequency associated with the AC power signal does not stabilize to within a predetermined range of frequencies within a predetermined period of time.

5. The recordable medium recited in claim 1, wherein the software code further comprises:
   code for checking the supply voltage level of one or more electrical components of the electrical wiring device; code for initializing a watch dog timer function in a processing device of the electrical wiring device; code for activating one or more input or output ports of the processing device.

6. The recordable medium recited in claim 1, wherein the software code further comprises: code for detecting an edge of a line input voltage signal; code for determining a frequency of the line input signal based on a relative timing of the detected edge.

7. An electrical wiring device comprising:
   a processing device having stored software code;
   an interrupting device electrically connecting one or more line terminals to one or more load terminals when the circuit interrupting device is in a reset condition and disconnecting the line terminals from the load terminals when the circuit interrupting device is in a tripped condition; and
   a fault detection circuit that detects a fault condition in the circuit interrupting device and generates a fault detection signal when the fault condition is detected, the fault detection signal being provided to the interrupting device to place the circuit interrupting device in the tripped condition, wherein the stored software code includes code for setting one or more input/output (I/O) ports of the processing device to either an input port or an output port, and
   wherein the stored software code includes code for determining an end-of-life state if a test signal from the fault detection circuit is less than a threshold value a predetermined number of times within a predetermined time period, and code for generating an alarm signal when the end-of-life state is determined.

8. The electrical wiring device claimed in claim 7, further comprising: an auto-monitoring circuit including the processing device electrically coupled to the fault detection circuit and the interrupting device and continuously monitoring one or more signals to determine an operating state of the electrical wiring device.

9. The electrical wiring device claimed in claim 8, wherein the software code of the processing device further includes: code for initiating at least one self-test timer having a respective timing variable for enabling the software code to operate different processing functions at different timing requirements.

10. The electrical wiring device claimed in claim 9, wherein the software code of the processing device further includes: code for initializing an analog-to-digital (A2D) converter in the processing device.

11. A method for auto-monitoring a ground fault circuit interrupter device comprising the steps of:
  monitoring a test signal output from a fault detection circuit to determine an operational state of the electrical wiring device;
  determining an end-of-life state if the test signal from the fault detection circuit is less than a minimum threshold value for a first predetermined number of testing times within a first predetermined time period;
  determining the end-of-life state if the test signal from the fault detection circuit is greater than a maximum threshold value for a second predetermined number of testing times within a second predetermined time period; and
  generating an alarm signal when the end-of-life state is determined.

12. The method claimed in claim 11, further comprising:
  monitoring an output signal from a contacts sensing device; and
  based on the output signal from the contacts sensing device, determining whether the electrical wiring device is in a tripped state in which an AC power signal is prevented from being delivered to a load, or in a reset state in which the AC power signal is delivered to the load.

13. The method claimed in claim 12, further comprising:
  determining, in the programmable circuit device, a frequency associated with the AC power signal based on an evaluation of the test signal;
  delaying the auto-monitoring program if the frequency associated with the AC power signal is not stable; and
  incrementing a fail tally if the frequency associated with the AC power signal does not stabilize to within a predetermined range of frequencies within a third predetermined period of time.

14. The method claimed in claim 13, further comprising:
  checking the supply voltage level of one or more electrical components of the electrical wiring device;
  initializing a watch dog timer function in a processing device of the electrical wiring device;
  activating one or more input or output ports of the processing device;
  detecting an edge of a line input voltage signal; and
  determining a frequency of the line input signal based on a relative timing of the detected edge.

15. The method claimed in claim 11, further comprising:
  checking the supply voltage level of one or more electrical components of the electrical wiring device;
  initializing a watch dog timer function in a processing device of the electrical wiring device;
  activating one or more input or output ports of the processing device;
  detecting an edge of a line input voltage signal; and
  determining a frequency of the line input signal based on a relative timing of the detected edge.

* * * * *